United States Patent
Maejima

(10) Patent No.: US 8,780,636 B2
(45) Date of Patent: Jul. 15, 2014

(54) REWRITABLE NONVOLATILE SEMICONDUCTOR MEMORY DEVICE WITH STACKED MEMORY CELLS

(75) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 173 days.

(21) Appl. No.: 13/423,518

(22) Filed: Mar. 19, 2012

(65) Prior Publication Data

US 2012/0307562 A1    Dec. 6, 2012

(30) Foreign Application Priority Data

Jun. 2, 2011    (JP) ................................. P2011-124134

(51) Int. Cl.
*G11C 16/04*    (2006.01)
*G11C 16/30*    (2006.01)

(52) U.S. Cl.
CPC ...................................... *G11C 16/30* (2013.01)
USPC ............. 365/185.18; 365/185.17; 365/189.09

(58) Field of Classification Search
CPC ......... G11C 16/10; G11C 16/30; G11C 16/12
USPC ...................... 365/185.18, 60, 185.17, 189.09
See application file for complete search history.

(56) References Cited

U.S. PATENT DOCUMENTS

| | | | | |
|---|---|---|---|---|
| 6,639,373 B2 * | 10/2003 | Knight et al. | ................. | 318/500 |
| 7,576,523 B2 * | 8/2009 | Ogawa et al. | ................. | 323/274 |
| 7,852,675 B2 | 12/2010 | Maejima | | |
| 8,334,551 B2 * | 12/2012 | Itagaki et al. | ................. | 257/216 |
| 8,564,258 B2 * | 10/2013 | Suzuki | ........................... | 323/242 |
| 2009/0033408 A1 * | 2/2009 | Fifield | ........................... | 327/537 |

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A nonvolatile semiconductor memory device according to an embodiment includes: a semiconductor substrate; a memory cell array including a plurality of memory cells, the memory cells being stacked on the semiconductor substrate; and a power supply circuit provided on the semiconductor substrate. The power supply circuit includes: a pump circuit configured to generate a voltage and supply the voltage to the memory cell array; a limiter circuit configured to output control signal for activating the pump circuit according to a comparison result between a voltage value of the output terminal and a first value; a capacitor configured to adjust a voltage of the output terminal; a boost circuit configured to charge the capacitor using a constant current based on the control signal; and a switch configured to stop a charge operation of the boost circuit. The capacitor is provided directly below the memory cell array.

20 Claims, 16 Drawing Sheets

Timing Chart of During Write Operation According to First Embodiment

Timing Chart of During Read Operation According to First Embodiment

Comparative Example

Comparative Example

REWRITABLE NONVOLATILE SEMICONDUCTOR MEMORY DEVICE WITH STACKED MEMORY CELLS

CROSS REFERENCE TO RELATED APPLICATION

This application is based upon and claims the benefit of priority from prior Japanese Patent Application No. 2011-124134, filed on Jun. 2, 2011, the entire contents of which are incorporated herein by reference.

BACKGROUND

1. Field

The embodiments described below relate to an electrically data rewritable nonvolatile semiconductor memory device.

2. Description of the Related Art

Stacking of memory cells is expected to improve the degree of integration in nonvolatile semiconductor memory devices such as NAND type flash memory. Proposed as an example of such a device is a stacked type NAND type flash memory employing vertical transistors as memory cells.

DETAILED DESCRIPTION

Figure 1:
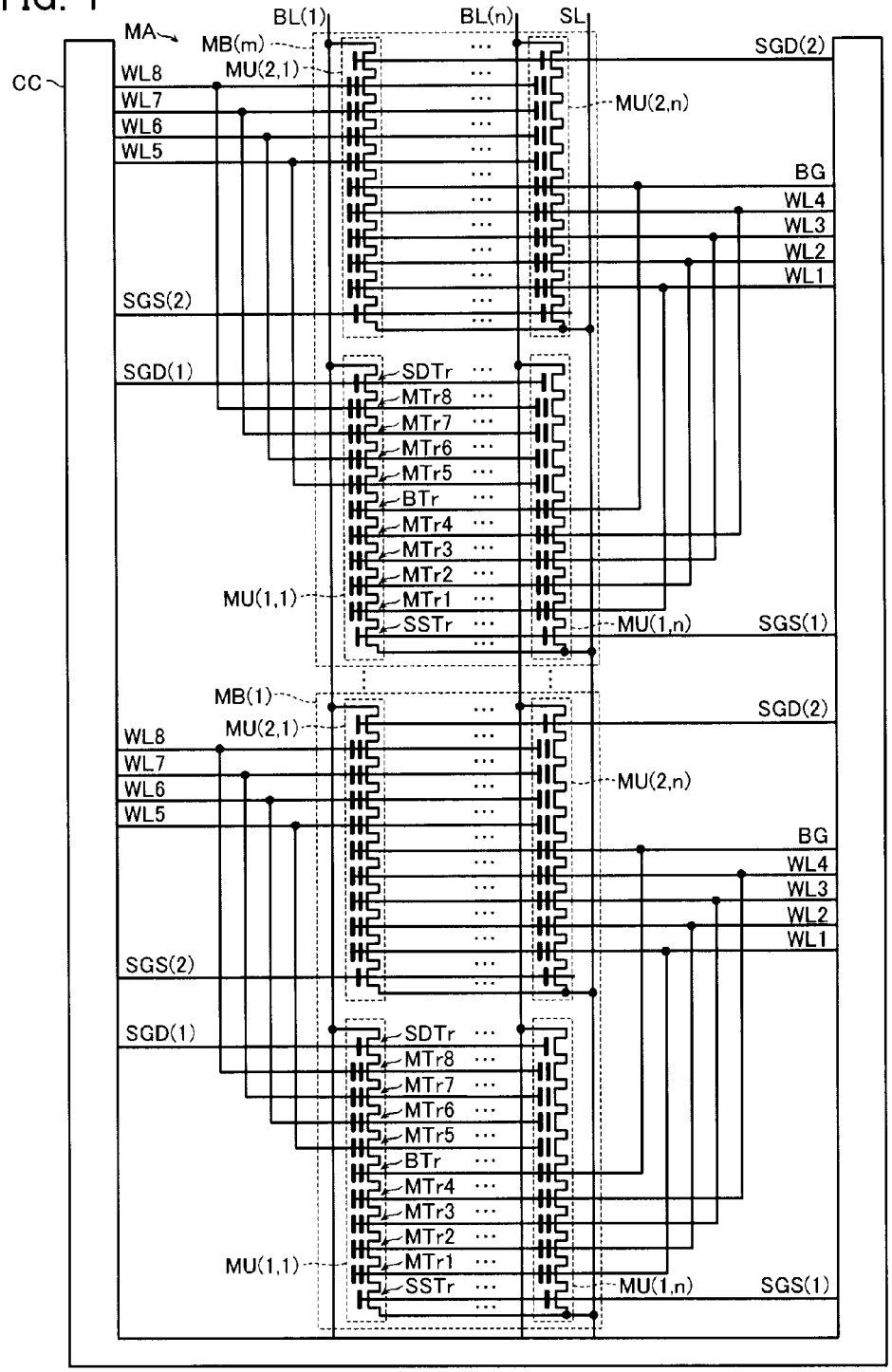
FIG. 1 is a view showing a memory cell array MA and a peripheral circuit CC in a nonvolatile semiconductor memory device according to a first embodiment.

A nonvolatile semiconductor memory device according to an embodiment includes: a semiconductor substrate; a memory cell array including a plurality of memory cells, the memory cells being stacked on the semiconductor substrate and being connected in series in a perpendicular direction with respect to the semiconductor substrate; and a power supply circuit provided on the semiconductor substrate and configured to supply a certain voltage to the memory cell array. The power supply circuit includes: a pump circuit configured to generate a voltage and supply the voltage to the memory cell array; a limiter circuit connected to an output terminal of the pump circuit, the limiter circuit being configured to output a control signal for activating the pump circuit according to a comparison result between a voltage value of the output terminal and a first value; a capacitor having one end connected to the output terminal, the capacitor being configured to adjust a voltage of the output terminal; a boost circuit connected to the other end of the capacitor, the boost circuit being configured to charge the capacitor using a constant current of a certain current value based on the control signal; and a switch configured to stop a charge operation of the boost circuit. The capacitor is provided directly below the memory cell array.

Regarding a memory cell array that includes memory cells stacked on a semiconductor substrate, consideration can be given to providing the various kinds of control circuits for the memory cell array, including the likes of decoders or drivers or a power supply circuit for supplying a voltage to the memory cell array, to beneath the memory cell array. However, in a stacked type NAND type flash memory, the problem arises of how to most efficiently dispose these control circuits underneath the memory cell array so as to minimize chip area.

Embodiments of a nonvolatile semiconductor memory device are described be low with reference to the drawings. During this description, common reference symbols are assigned to common parts throughout all the drawings. Moreover, dimensional ratios represented by the drawings are not limited to the ratios actually shown in the drawings.

First Embodiment

[Configuration of Nonvolatile Semiconductor Memory Device According to First Embodiment]

First, a schematic configuration of a nonvolatile semiconductor memory device according to a first embodiment is described with reference to FIG. 1. As shown in FIG. 1, the nonvolatile semiconductor memory device according to the first embodiment comprises a memory cell array MA and a peripheral circuit CC. Note that a specific configuration of the peripheral circuit CC is mentioned later.

As shown in FIG. 1, the memory cell array MA includes m columns of memory blocks MB (1), . . . , MB (m) (hereinafter may be described also as memory blocks MB).

Each of the memory blocks MB includes n rows and two columns of memory units MU(1,1)-MU(2,n) (hereinafter may be described also as memory units MU). Each of the memory units MU includes a memory string MS, a source side select transistor SSTr, and a drain side select transistor SDTr. One end of the memory unit MU is connected to a bit line BL, and the other end of the memory unit MU is connected to a source line SL. That is, one end of a current path of the drain side select transistor SDTr is connected to the bit line BL, and one end of a current path of the source side select transistor SSTr is connected to the source line SL.

As shown in FIG. 1, the memory string MS includes memory transistors MTr1-MTr8 (memory cells) and a back gate transistor BTr connected in series. The memory transistors MTr1-MTr4 and MTr5-MTr8 are each connected in series. The back gate transistor BTr is provided between the memory transistor MTr4 and the memory transistor MTr5.

The memory transistors MTr1-MTr8 retain data by storing a charge in their charge accumulation layer. The back gate transistor BTr is brought into a conductive state at least when the memory string MS is selected as target of an operation.

In the memory blocks MB (1)-MB (m), word lines WL1-WL8 are commonly connected to, respectively, gates of the n rows×two columns of memory transistors MTr1-MTr8. Moreover, a back gate line BG is commonly connected to gates of the n rows×two columns of back gate transistors BTr.

A drain of the source side select transistor SSTr is connected to a source of the memory string MS (source of the memory transistor MTr1). A source of the source side select transistor SSTr is connected to the source line SL. Source side select gate lines SGS (1) and SGS (2) (hereinafter may be described also as source side select gate lines SGS) are commonly connected to, respectively, gates of the source side select transistors SSTr aligned in odd-numbered columns (first column, third column, fifth column, . . . ) and even-numbered columns (second column, fourth column, sixth column, . . . ) in each of the memory blocks MB.

A source of the drain side select transistor SDTr is connected to a drain of the memory string MS (drain of the memory transistor MTr8). A drain of the drain side select transistor SDTr is connected to the bit line BL. Drain side select gate lines SGD (1) and SGD (2) (hereinafter drain side select gate lines SGD) are commonly connected to, respectively, gates of the drain side select transistors SDTr aligned in odd-numbered columns and even-numbered columns in each of the memory blocks MB.

[Stacked Structure]

Figure 2:
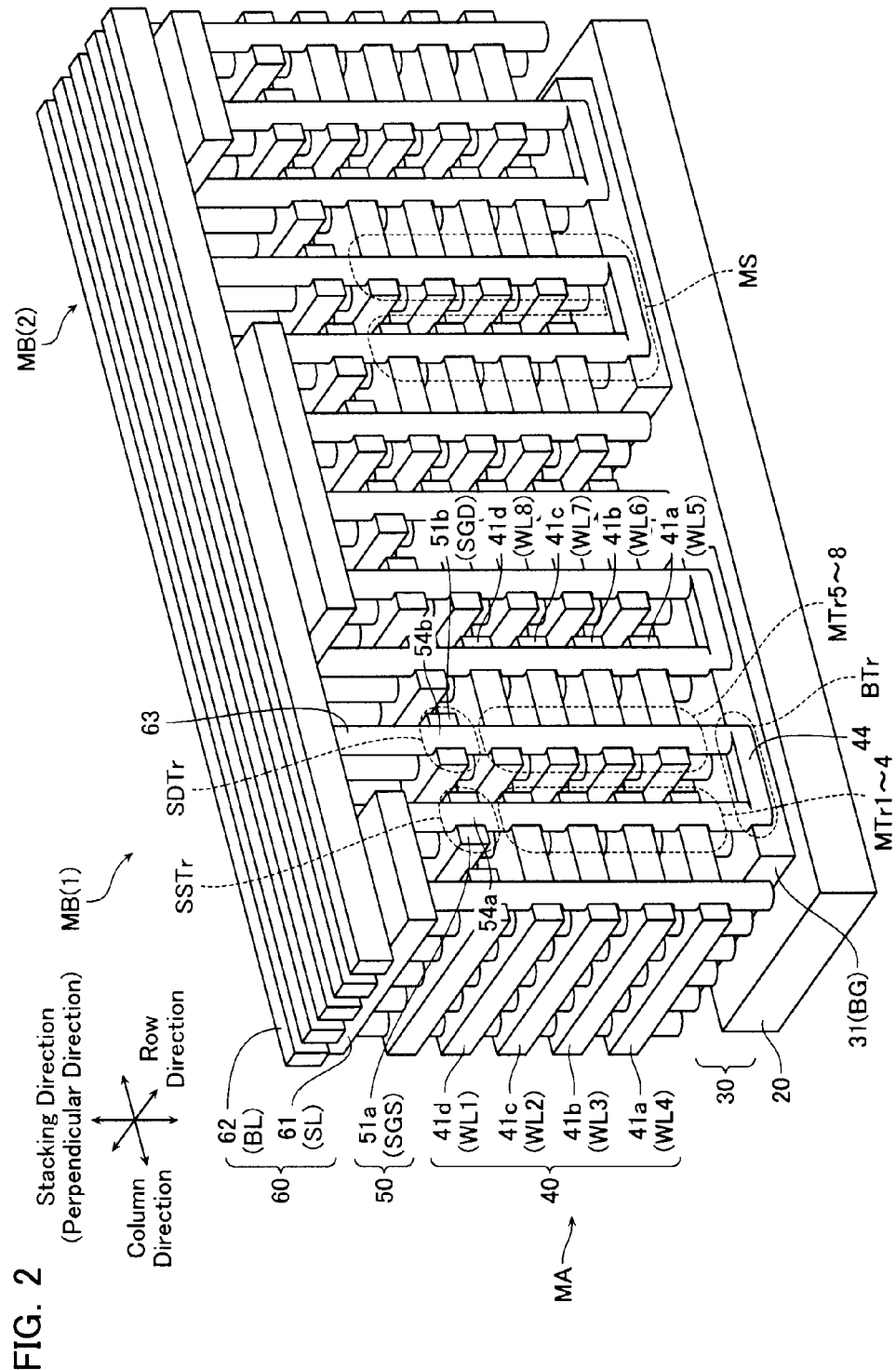
FIG. 2 is a perspective view showing a stacked structure of the memory cell array MA according to the first embodiment.
Figure 3:
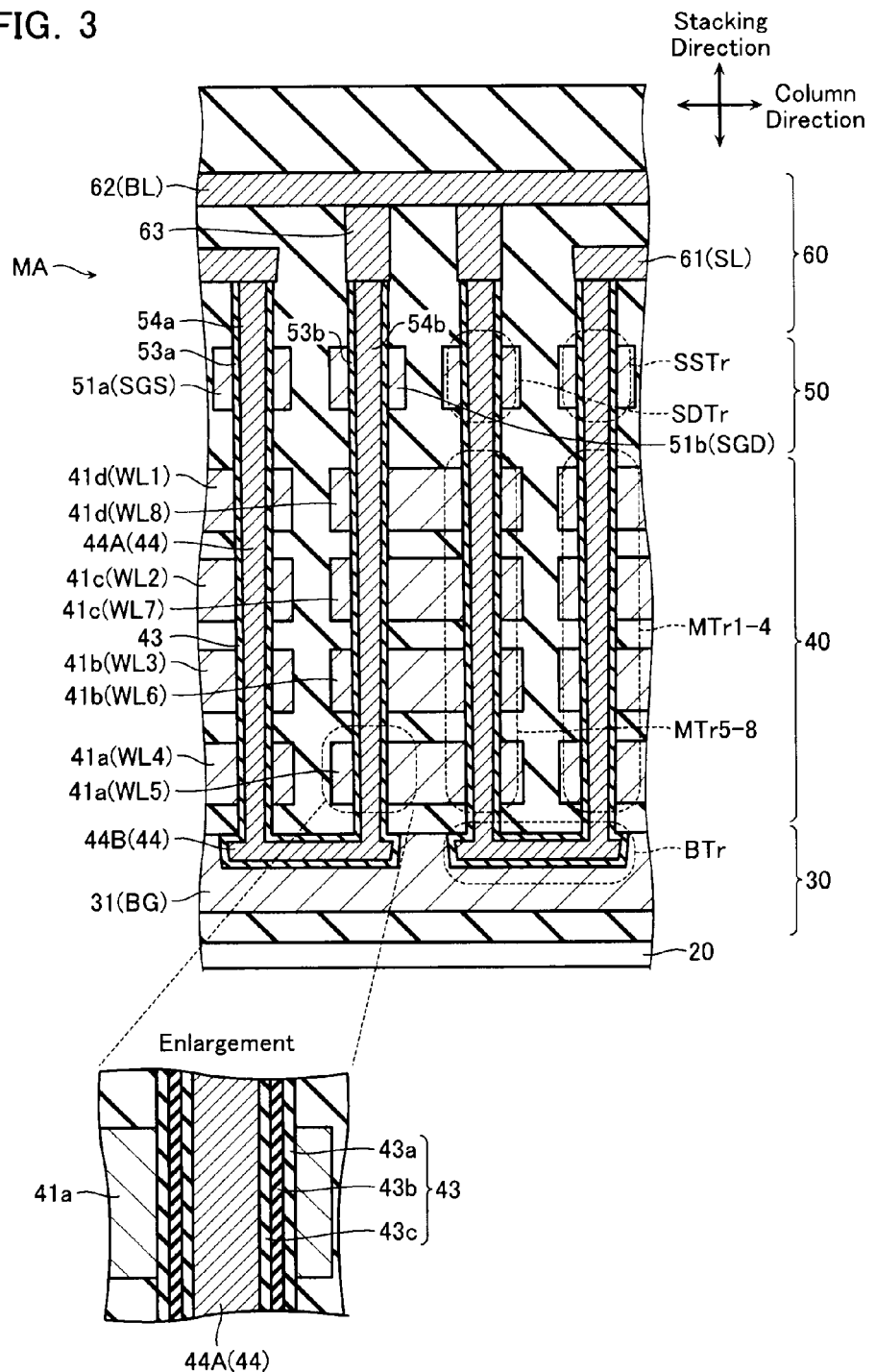
FIG. 3 is a cross-sectional view showing the stacked structure of the memory cell array MA according to the first embodiment.

Next, a stacked structure of the memory block MB according to the first embodiment is described with reference to FIGS. 2 and 3. FIG. 2 is a perspective view showing the memory cell array MA. FIG. 3 is a cross-sectional view showing the memory cell array MA. As shown in FIGS. 2 and 3, the memory block MB includes a back gate layer 30, a memory layer 40, a select transistor layer 50, and a wiring layer 60 stacked sequentially on a semiconductor substrate 20. The back gate layer 30 functions as the back gate transistor BTr. The memory layer 40 functions as the memory transistors MTr1-MTr8. The select transistor layer 50 functions as the drain side select transistor SDTr and the source side select transistor SSTr. The wiring layer 60 functions as the source line SL and the bit line BL.

As shown in FIGS. 2 and 3, the back gate layer 30 includes a back gate conductive layer 31. The back gate conductive layer 31 functions as the back gate line BG and as the gate of the back gate transistor BTr. The back gate conductive layer 31 is formed extending two-dimensionally in a row direction and a column direction parallel to the semiconductor substrate 20. The back gate conductive layer 31 is made from, for example, polysilicon (poly-Si).

As shown in FIG. 3, the back gate layer 30 includes a memory gate insulating layer 43 and a linking semiconductor layer 44B. The memory gate insulating layer 43 is provided between the linking semiconductor layer 44B and the back gate conductive layer 31. The linking semiconductor layer 44B functions as a body (channel) of the back gate transistor BTr. The linking semiconductor layer 44B is formed as dug in the back gate conductive layer 31. The linking semiconductor layer 44B is formed in a substantially rectangular shape having the column direction as a longitudinal direction, when seen from above. The linking semiconductor layers 44B are formed in a matrix arrangement in the row direction and the column direction. The linking semiconductor layer 44B is made from, for example, polysilicon (poly-Si).

As shown in FIGS. 2 and 3, the memory layer 40 is formed in a layer above the back gate layer 30. The memory layer 40 includes word line conductive layers 41a-41d. The word line conductive layer 41a functions as a word line WL4 and as a gate of the memory transistor MTr4. In addition, the word line conductive layer 41a functions as a word line WL5 and as a gate of the memory transistor MTr5. The word line conductive layer 41b functions as a word line WL3 and as a gate of the memory transistor MTr3. In addition, the word line conductive layer 41b functions as a word line WL6 and as a gate of the memory transistor MTr6. The word line conductive layer 41c functions as a word line WL2 and as a gate of the memory transistor MTr2. In addition, the word line conductive layer 41c functions as a word line WL7 and as a gate of the memory transistor MTr7. The word line conductive layer 41d functions as a word line WL1 and as a gate of the memory transistor MTr1. In addition, the word line conductive layer 41d functions as a word line WL8 and as a gate of the memory transistor MTr8.

The word line conductive layers 41a-41d are stacked sandwiching interlayer insulating layers therebetween. The word line conductive layers 41a-41d include a portion extending with the row direction as a longitudinal direction and having a certain pitch in the column direction. The word line conductive layers 41a-41d are made from, for example, polysilicon (poly-Si).

As shown in FIG. 3, the memory layer 40 includes the memory gate insulating layer 43 and a columnar semiconductor layer 44A. The memory gate insulating layer 43 is provided between the columnar semiconductor layer 44A and the word line conductive layers 41a-41d. The columnar semiconductor layer 44A functions as a body (channel) of the memory transistors MTr1-MTr8. The columnar semiconductor layer 44A is formed penetrating the word line conductive layers 41a-41d and the interlayer insulating layers. The columnar semiconductor layer 44A extends in the perpendicular direction with respect to the semiconductor substrate 20. A pair of the columnar semiconductor layers 44A are formed aligning with end vicinities in the column direction of the linking semiconductor layer 44B. The columnar semiconductor layer 44A is made from, for example, polysilicon (poly-Si).

That is, in the back gate layer 30 and the memory layer 40, a memory semiconductor layer 44 includes the pair of columnar semiconductor layers 44A and the linking semiconductor layer 44B joining lower ends of the pair of columnar semiconductor layers 44A, and functions as a body (channel) of the memory string MS. The memory semiconductor layer 44 is formed as dug in the interlayer insulating layers of the memory layer 40 and the back gate conductive layer 31. The memory semiconductor layer 44 is formed in a U-letter shape when seen in the row direction.

The memory gate insulating layer 43 includes a block insulating layer 43a, a charge accumulation layer 43b, and a tunnel insulating layer 43c. The block insulating layer 43a is formed on a side surface of the columnar semiconductor layer 44A and on a side surface of the linking semiconductor layer 44B. The charge accumulation layer 43b is formed on a side surface of the block insulating layer 43a. The charge accumulation layer 43b is configured capable of storing charges. The tunnel insulating layer 43c is formed between the charge accumulation layer 43b and the memory semiconductor layer 44. The block insulating layer 43a and the tunnel insulating layer 43c are made from, for example, silicon oxide ($SiO_2$). The charge accumulation layer 43b is made from, for example, silicon nitride (SiN).

Expressing the above-described configuration of the back gate layer 30 in other words, the back gate conductive layer 31 is formed surrounding side surfaces and a lower surface of the linking semiconductor layer 44B via the memory gate insulating layer 43. Moreover, expressing the above-described configuration of the memory layer 40 in other words, the word line conductive layers 41a-41d are formed surrounding a side surface of the columnar semiconductor layer 44A via the memory gate insulating layer 43.

As shown in FIGS. 2 and 3, the select transistor layer 50 includes a source side conductive layer 51a and a drain side conductive layer 51b. The source side conductive layer 51a functions as the source side select gate line SGS and as a gate of the source side select transistor SSTr. The drain side conductive layer 51b functions as the drain side select gate line SGD and as a gate of the drain side select transistor SDTr.

The source side conductive layer 51a is formed above one of the columnar semiconductor layers 44A configuring the memory conductive layer 44. The drain side conductive layer 51b is formed in the same layer as the source side conductive layer 51a, and above the other of the columnar semiconductor layers 44A configuring the memory conductive layer 44. A plurality of the source side conductive layers 51a and the drain side conductive layers 51b extend in the row direction having a certain pitch in the column direction. The source side conductive layer 51a and the drain side conductive layer 51b are made from, for example, polysilicon (poly-Si).

As shown in FIG. 3, the select transistor layer 50 includes a source side gate insulating layer 53a, a source side columnar semiconductor layer 54a, a drain side gate insulating layer 53b, and a drain side columnar semiconductor layer 54b. The source side columnar semiconductor layer 54a functions as a body (channel) of the source side select transistor SSTr. The drain side columnar semiconductor layer 54b functions as a body (channel) of the drain side select transistor SDTr.

The source side gate insulating layer 53a is provided between the source side conductive layer 51a and the source side columnar semiconductor layer 54a. The source side columnar semiconductor layer 54a is formed penetrating the source side conductive layer 51a. The source side columnar semiconductor layer 54a is formed in a column shape extending in the perpendicular direction with respect to the semiconductor substrate 20 and is connected to a side surface of the source side gate insulating layer 53a and an upper surface of one of the pair of columnar semiconductor layers 44A. The source side gate insulating layer 53a is made from, for example, silicon oxide ($SiO_2$). The source side columnar semiconductor layer 54a is made from, for example, polysilicon (poly-Si).

The drain side gate insulating layer 53b is provided between the drain side conductive layer 51b and the drain side columnar semiconductor layer 54b. The drain side columnar semiconductor layer 54b is formed penetrating the drain side conductive layer 51b. The drain side columnar semiconductor layer 54b is formed in a column shape extending in the perpendicular direction with respect to the semiconductor substrate 20 and is connected to a side surface of the drain side gate insulating layer 53b and an upper surface of the other of the pair of columnar semiconductor layers 44A. The drain side gate insulating layer 53b is made from, for example, silicon oxide ($SiO_2$). The drain side columnar semiconductor layer 54b is made from, for example, polysilicon (poly-Si).

The wiring layer 60 includes a source line layer 61, a bit line layer 62, and a plug layer 63. The source line layer 61 functions as the source line SL. The bit line layer 62 functions as the bit line BL.

The source line layer 61 is formed extending in the row direction and in contact with an upper surface of the source side columnar semiconductor layer 54a. The bit line layer 62 is formed extending in the column direction and in contact with an upper surface of the drain side columnar semiconductor layer 54b via the plug layer 63. The source line layer 61, the bit line layer 62, and the plug layer 63 are made from, for example, a metal such as tungsten (W).

[Targets of Control in Operations in First Embodiment]

Figure 4:
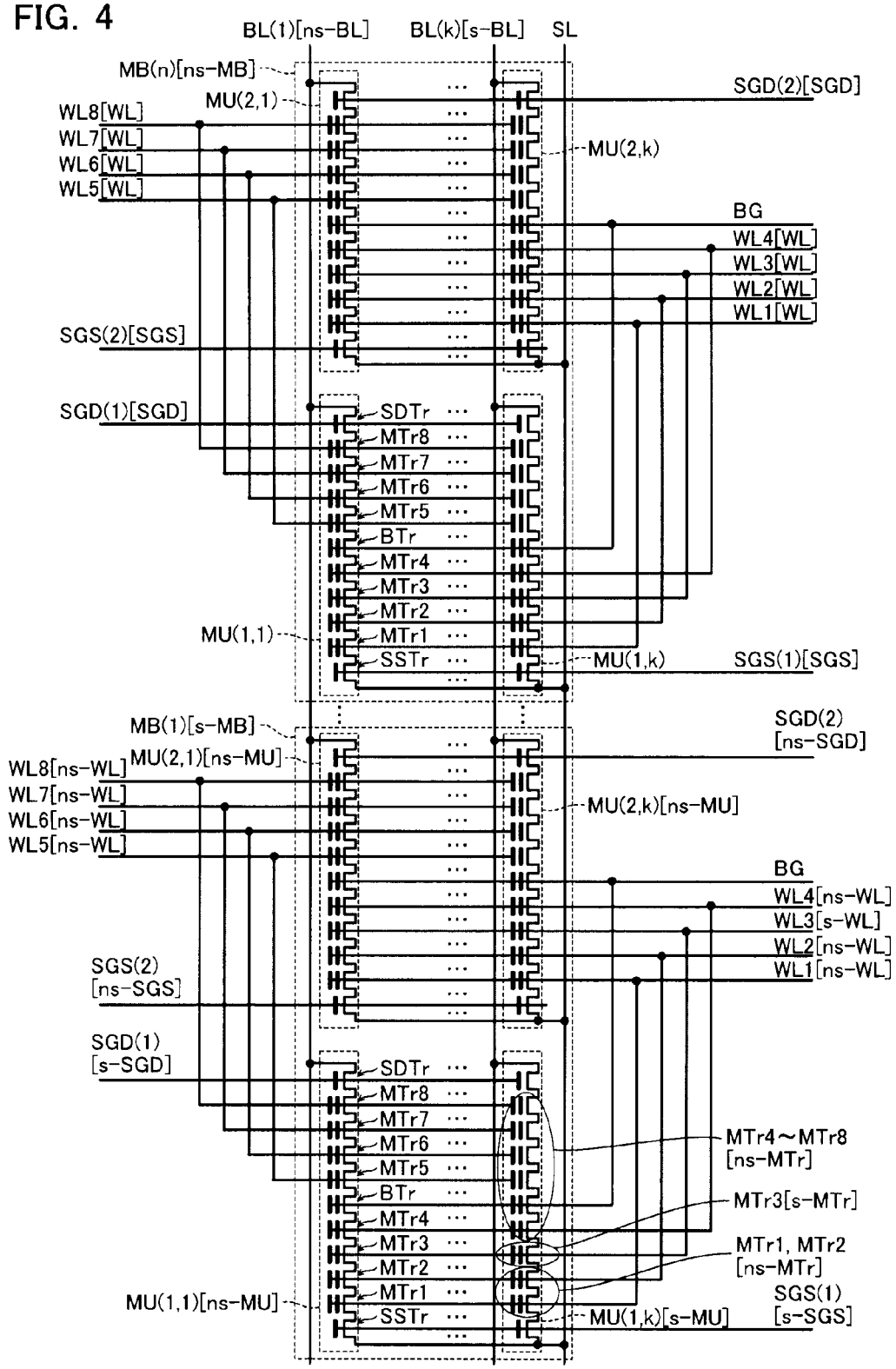
FIG. 4 is a view showing targets of control in operations of the memory cell array MA according to the first embodiment.

Next, targets of control in operations to be described below are described with reference to FIG. 4. During a program operation, the peripheral circuit CC sets various kinds of lines to select or non-select state as shown in FIG. 4 and controls voltages of the various lines. The operation is executed on a selected memory transistor s-MTr included in a selected memory unit s-MU in a selected memory block s-MB.

For example, in the example shown in FIG. 4, memory block MB(1) is a selected memory block s-MB, and other memory blocks MB are non-selected memory blocks ns-MB. Memory unit MU(1,k) in memory block MB(1) which is the selected memory block s-MB is a selected memory unit s-MU. Other memory units MU in memory block MB(1) are non-selected memory units ns-MU. In the selected memory unit s-MU, memory transistor MTr3 is a selected memory transistor s-MTr, and other memory transistors MTr are non-selected memory transistors ns-MTr.

For example, in the example shown in FIG. 4, bit line BL(k) is a selected bit line s-BL, and other bit lines BL are non-selected bit lines ns-BL. In the selected memory block s-MB, word line WL3 is a selected word line s-WL, and other word lines WL are non-selected word lines ns-WL. Moreover, in the selected memory block s-MB, source side select gate line SGS(1) and drain side select gate line SGD(1) are a selected source side select gate line s-SGS and a selected drain side select gate line s-SGD, respectively. Source side select gate line SGS(2) and drain side select gate line SGD(2) are a non-selected source side select gate line ns-SGS and a non-selected drain side select gate line ns-SGD, respectively.

[Program Operation in First Embodiment]

Figure 5:
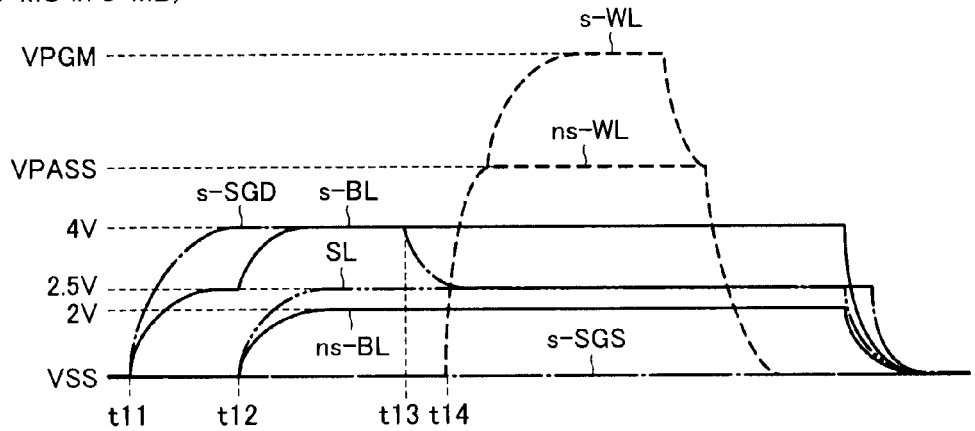
FIG. 5 is a timing chart during a program operation according to the first embodiment.
Figure 5:
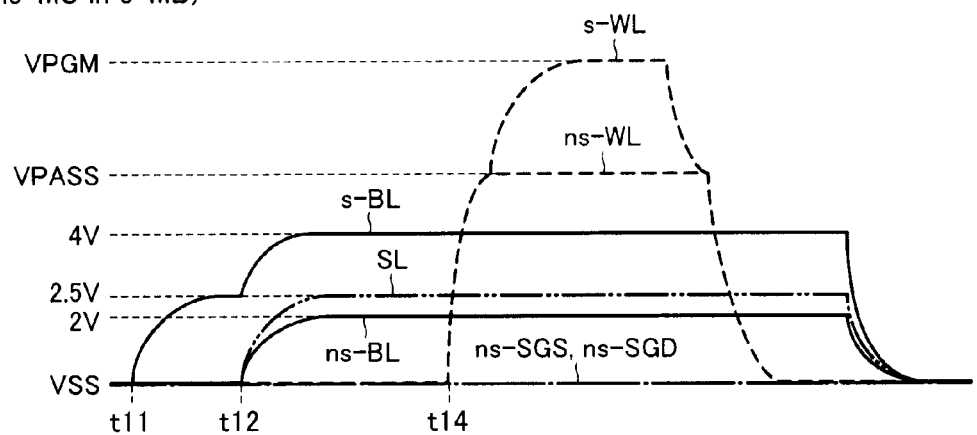
Figure 5:
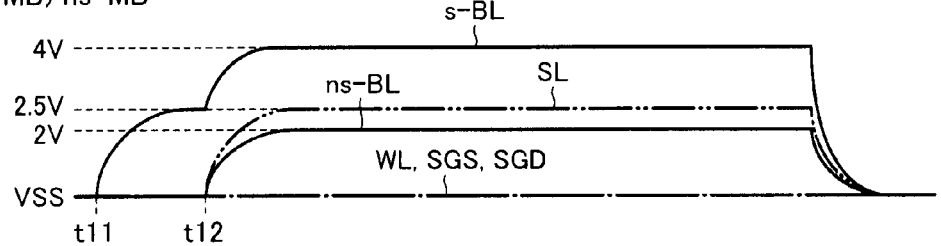

Next, a program operation according to the first embodiment is described specifically, with reference to FIG. 5. FIG. 5 is a timing chart during the program operation according to the first embodiment. FIG. 5 (s-MU ins-MB) shows voltages of lines related to selected memory unit s-MU. FIG. 5 (ns-MU in s-MB) shows voltages of lines related to non-selected memory units ns-MU. FIG. 5 (ns-MB) shows voltages of lines related to non-selected memory blocks ns-MB. As shown in FIG. 5 (s-MU in s-MB), (ns-MU in s-MB), and (ns-MB), first, from time ti1, a voltage of selected bit line s-BL is raised to 2.5 V. In addition, a voltage of selected drain side select gate line s-SGD is raised to 4 V. Meanwhile, selected source side select gate line s-SGS is maintained at a voltage VSS.

Then, at time t12, a transistor provided, for example, between a sense amplifier S/A and the bit line BL is controlled (a transistor connected to selected bit line s-BL is set to an off state) to bring selected bit line s-BL into a floating state. In addition, a voltage of non-selected bit line ns-BL is raised to 2 V, and a voltage of source line SL is raised to 2.5 V. Due to coupling accompanying these voltage rises, the voltage of selected bit line s-BL rises to 4 V.

Next, at time t13, selected drain side select gate line s-SGD is lowered to 2.5 V.

Then, from time t14, selected word line s-WL and non-selected word lines ns-WL are raised to a voltage VPASS. As a result, non-selected memory transistors ns-MTr in selected memory units-MU become the conductive state. Subsequently, selected word line s-WL is raised to a voltage VPGM. This causes a high voltage to be applied to a gate of selected memory transistor s-MTr in selected memory unit s-MU. That is, the program operation is executed on selected memory transistor s-MTr.

At the above-described times t11-t14, non-selected drain side select gate line ns-SGD and non-selected source side select gate line ns-SGS are maintained at voltage Vss. As a result, the drain side select transistors SDTr and the source side select transistors SSTr in non-selected memory units ns-MU are retained in a non-conductive state. Accordingly, gates of memory transistors MTr in non-selected memory units ns-MU are not applied with a high voltage, that is, the program operation on these memory transistors MTr is prohibited.

At the above-described times t11-t14, the word lines WL, the drain side select gate lines SGD, and the source side select gate lines SGS in non-selected memory blocks ns-MB are maintained at voltage VSS. Accordingly, gates of memory transistors MTr in non-selected memory blocks ns-MB are not applied with a high voltage, that is, the program operation on these memory transistors MTr is prohibited.

[Read Operation in First Embodiment]

Figure 6:
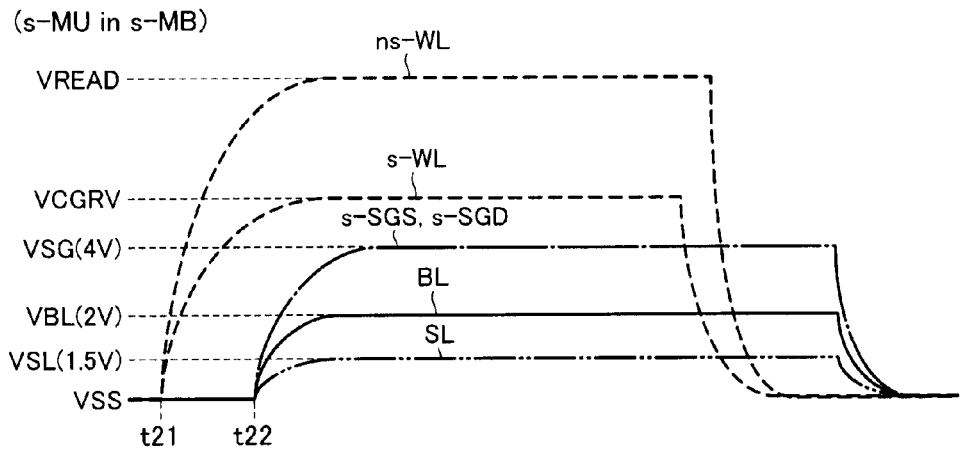
FIG. 6 is a timing chart during a read operation according to the first embodiment.
Figure 6:
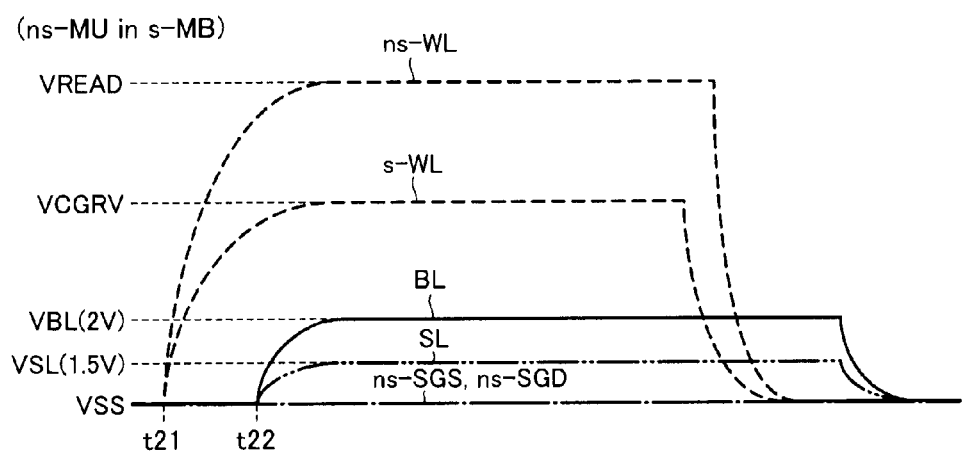
Figure 6:
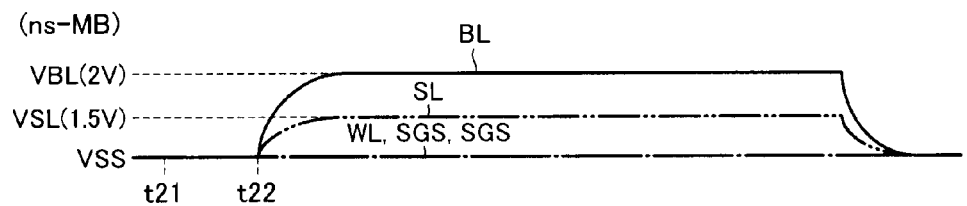

Next, a read operation according to the first embodiment is described with reference to FIG. 6. FIG. 6 is a timing chart during the read operation according to the first embodiment.

Note that for convenience of explanation, FIG. 6 shows a timing chart in the case of adopting a system in which a plurality of adjacent bit lines BL are read simultaneously (ABL (All Bit Line) sensing system). However, a read system in the embodiment is not limited to this, and other read systems may also be adopted.

First, from time t21, selected word line s-WL is raised to a voltage VCGRV, and non-selected word lines ns-WL are raised to a voltage VREAD. Then, at time t22, selected source side select gate line s-SGS and selected drain side select gate line s-SGD are raised to a voltage VSG (4 V). In addition, the bit line BL is raised to a voltage VBL (2 V), and the source line SL is raised to a voltage VSL (1.5 V).

The above causes a current to flow from the bit line BL to the source line SL according to data in selected memory transistor s-MTr. Data in selected memory transistor s-MTr is read by detection of this current.

[Configuration of Peripheral Circuit CC]

Figure 7:
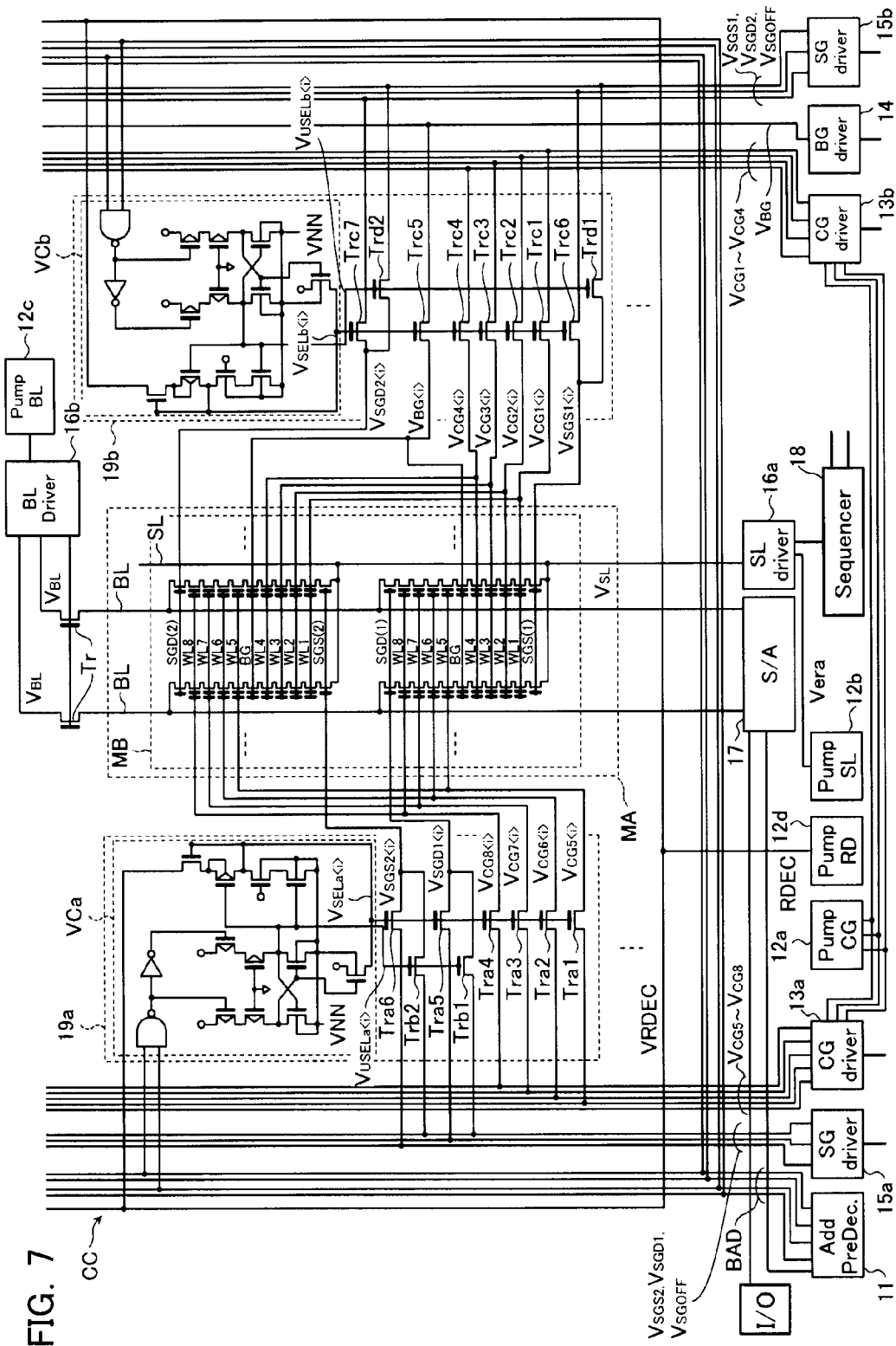
FIG. 7 is a circuit diagram showing the peripheral circuit CC according to the first embodiment.

Next, a specific configuration of the peripheral circuit CC in the above-described first embodiment is described with reference to FIG. 7. As shown in FIG. 7, the peripheral circuit CC includes an address decoder circuit 11, boost circuits 12a-12d, word line drive circuits 13a and 13b, a back gate line drive circuit 14, select gate line drive circuits 15a and 15b, a source line drive circuit 16a, a bit line drive circuit 16b, a sense amplifier circuit 17, a sequencer 18, and row decoders 19a and 19b.

The address decoder circuit 11 is connected to the row decoders 19a and 19b via a bus. The address decoder circuit 11 outputs a signal BAD to the row decoders 19a and 19b. The signal BAD designates the memory block MB (block address).

The boost circuits 12a-12d generate a boost voltage by boosting a reference voltage. The boost circuit 12a is connected to the word line drive circuits 13a and 13b. The boost circuit 12a transmits a boosted voltage to the word line drive circuits 13a and 13b. The boost circuit 12b is connected to the source line drive circuit 16a. The boost circuit 12b outputs a boosted voltage to the source line drive circuit 16a. The boost circuit 12c is connected to the bit line drive circuit 16b. The boost circuit 12c outputs a boosted voltage to the bit line drive circuit 16b. The boost circuit 12d is connected to the row decoders 19a and 19b. The boost circuit 12d outputs a boosted signal VRDEC to the row decoders 19a and 19b.

The word line drive circuit 13a is connected to the row decoder 19a. The word line drive circuit 13a outputs signals VCG5-VCG8 to the row decoder 19a. The word line drive circuit 13b is connected to the row decoder 19b. The word line drive circuit 13b outputs signals VCG1-VCG4 to the row decoder 19b. The signals VCG1-VCG8 are used when driving the word lines WL1-WL8 in a selected memory block MB.

The back gate line drive circuit 14 is connected to the row decoder 19b. The back gate line drive circuit 14 outputs a signal VBG to the row decoder 19b. The signal VBG is used when driving the back gate line BG in a selected memory block MB.

The select gate line drive circuit 15a is connected to the row decoder 19a. The select gate line drive circuit 15a outputs a signal VSGS2, a signal VSGD1, and a signal VSGOFF to the row decoder 19a. The select gate line drive circuit 15b is connected to the row decoder 19b. The select gate line drive circuit 15b outputs a signal VSGS1, a signal VSGD2, and the signal VSGOFF to the row decoder 19b. The signals VSGS1 and VSGS2 are used when driving, respectively, the source side select gate lines SGS (1) and SGS (2) in a selected memory block MB. The signals VSGD1 and VSGD2 are used when driving, respectively, the drain side select gate lines SGD (1) and SGD (2) in a selected memory block MB. The signal VSGOFF is used when driving the source side select gate lines SGS (1) and SGS (2), and the drain side select gate lines SGD (1) and SGD (2) in a non-selected memory block MB.

The above-described signal VSGS2, signal VSGD1, and signal VSGOFF are inputted from the select gate line drive circuit 15a to the various lines via the row decoder 19a. Moreover, the signals VSGOFF, VSGD2, and VSGS1 are inputted from the select gate line drive circuit 15b to the various lines via the row decoder 19b.

The source line drive circuit 16a is connected to the source line SL. The source line drive circuit 16a outputs a signal VSL to the source line SL. The signal VSL is used when driving the source line SL. The bit line drive circuit 16b is connected to the bit line BL. The bit line drive circuit 16b selectively supplies a signal VBL to the bit line BL, via a transfer transistor Tr. The signal VBL is used when driving the bit line BL.

The sense amplifier circuit 17 is connected to the bit line BL. The sense amplifier circuit 17 determines data retained by the memory transistors MTr1-MTr8 based on a change in voltage of the bit line BL. The sequencer 18 is connected to the above-described circuits 11-17. The sequencer 18 supplies control signals to the circuits 11-17 to control these circuits.

The row decoders 19a and 19b are provided one each to one memory block MB. The row decoder 19a is connected to the word lines WL5-WL8, the source side select gate line SGS (2), and the drain side select gate line SGD (1).

The row decoder 19b is connected to the word lines WL1-WL4, the back gate line BG, the drain side select gate line SGD (2), and the source side select gate line SGS (1). The row decoder 19*a* inputs signals VCG5<i>-VCG8<i> to gates of the memory transistors MTr5-MTr8 via the word lines WL5-WL8 based on the signal BAD and the signals VCG5-VCG8. In addition, the row decoder 19*a* selectively inputs a signal VSGS2<i> to a gate of the source side select transistor SSTr located in the second column of memory block MB, via the source side select gate line SGS (2), based on the signal BAD, the signal VSGS2, and the signal VSGOFF. Moreover, the row decoder 19*a* selectively inputs a signal VSGD1<i> to a gate of the drain side select transistor SDTr located in the first column of memory block MB, via the drain side select gate line SGD (1), based on the signal BAD, the signal VSGD1, and the signal VSGOFF.

The row decoder 19*a* includes a voltage converting circuit VCa, first transfer transistors Tra1-Tra6, and second transfer transistors Trb1 and Trb2. The voltage converting circuit VCa is connected to the address decoder circuit 11, the boost circuit 12*d*, gates of the first transfer transistors Tra1-Tra6, and gates of the second transfer transistors Trb1 and Trb2. The voltage converting circuit VCa generates a signal VSELa<i> based on the signal BAD and the signal VRDEC, and outputs this signal VSELa<i> to the gates of the first transfer transistors Tra1-Tra6. In addition, the voltage converting circuit VCa generates a signal VUSELa<i> based on the signal BAD and the signal VRDEC, and outputs this signal VUSELa<i> to the gates of the second transfer transistors Trb1 and Trb2.

The first transfer transistors Tra1-Tra4 are connected between the word line drive circuit 13*a* and, respectively, the word lines WL5-WL8. The first transfer transistors Tra1-Tra4 output, respectively, signals VCG5<i>-VCG8<i> to the word lines WL5-WL8, based on the signals VCG5-VCG8 and VSELa<i>. The first transfer transistor Tra5 is connected between the select gate line drive circuit 15*a* and the drain side select gate line SGD (1). The first transfer transistor Tra6 is connected between the select gate line drive circuit 15*a* and the source side select gate line SGS (2).

The second transfer transistor Trb1 is connected between the select gate line drive circuit 15*a* and the drain side select gate line SGD (1). The second transfer transistor Trb2 is connected between the select gate line drive circuit 15*a* and the source side select gate line SGS(2).

The row decoder 19*b* inputs signals VCG1<i>-VCG4<i> to gates of the memory transistors MTr1-MTr4 via the word lines WL1-WL4 based on the signal BAD and the signals VCG1-VCG4. In addition, the row decoder 19*b* inputs a signal VBG<i> to a gate of the back gate transistor BTr via the back gate line BG based on the signal BAD and the signal VBG. Moreover, the row decoder 19*b* selectively inputs a signal VSGS1<i> to a gate of the source side select transistor SSTr located in the first column of memory block MB, via the source side select gate line SGS(1), based on the signal BAD, the signal VSGS1, and the signal VSGOFF. In addition, the row decoder 19*b* selectively inputs a signal VSGD2<i> to a gate of the drain side select transistor SDTr located in the second column of memory block MB, via the drain side select gate line SGD(2), based on the signal BAD, the signal VSGD2, and the signal VSGOFF.

The row decoder 19*b* includes a voltage converting circuit VCb, first transfer transistors Trc1-Trc7, and second transfer transistors Trd1 and Trd2. The voltage converting circuit VCb is connected to the address decoder circuit 11, the boost circuit 12*d*, gates of the first transfer transistors Trc1-Trc7, and gates of the second transfer transistors Trd1 and Trd2. The voltage converting circuit VCb generates a signal VSELb<i> based on the signal BAD and the signal VRDEC, and outputs this signal VSELb<i> to the gates of the first transfer transistors Trc1-Trc7. In addition, the voltage converting circuit VCb generates a signal VUSELb<i> based on the signal BAD and the signal VRDEC, and outputs this signal VUSELb<i> to the gates of the second transfer transistors Trd1 and Trd2.

The first transfer transistors Trc1-Trc4 are connected between the word line drive circuit 13*b* and, respectively, the word lines WL1-WL4. The first transfer transistors Trc1-Trc4 output, respectively, signals VCG1<i>-VCG4<i> to the word lines WL1-WL4, based on the signals VCG1-VCG4 and VSELb<i>. The first transfer transistor Trc5 is connected between the back gate line drive circuit 14 and the back gate line BG. The first transfer transistor Trc5 outputs a signal VBG<i> to the back gate line BG based on the signal VBG and the signal VSELb<i>. The first transfer transistor Trc6 is connected between the select gate line drive circuit 15*b* and the source side select gate line SGS (1). The first transfer transistor Trc7 is connected between the select gate line drive circuit 15*b* and the drain side select gate line SGD (2).

The second transfer transistor Trd1 is connected between the select gate line drive circuit 15*b* and the source side select gate line SGS (1). The second transfer transistor Trd2 is connected between the select gate line drive circuit 15*b* and the drain side select gate line SGD(2).

Figure 8:
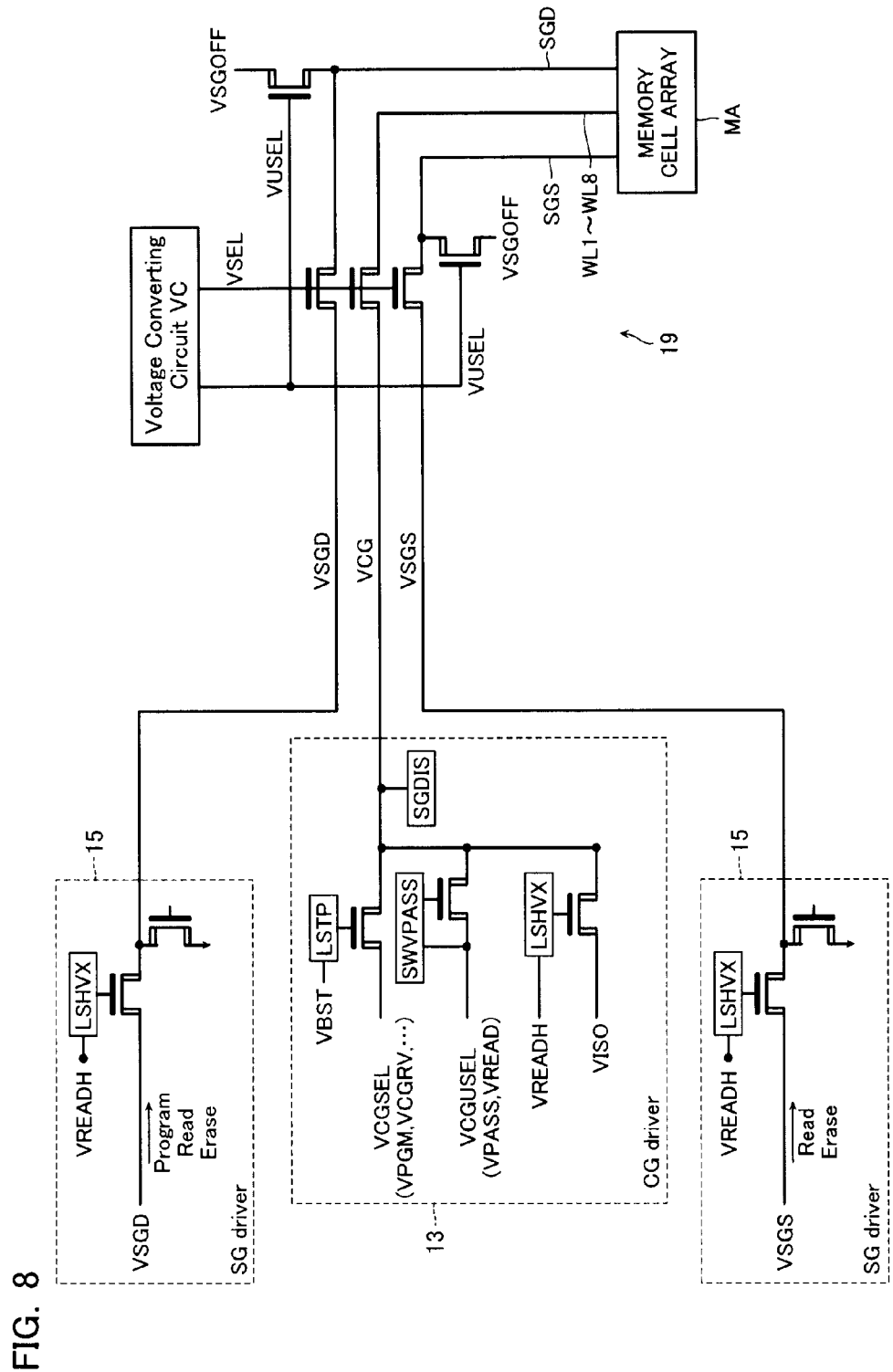
FIG. 8 is a circuit diagram showing various kinds of drivers according to the first embodiment.

Next, drive circuits for driving the word lines WL, the drain side select gate lines SGD, and the source side select gate lines SGS via the row de coders 19 are described with reference to FIGS. 8 and 9. As shown in FIG. 8, the word line drive circuit 13 supplies voltages VPGM, VCGRV, VPASS, VREAD, and so on (signal VCG) required in each of the above-described operations, to the memory cell array MA, from the lines VCGSEL, VCGUSEL, and so on. In addition, the word line drive circuit 13 includes a discharging circuit SGDIS having a discharge function. The select gate line drive circuit 15, after adjusting a voltage required in the above-described operations using a level shifter LSHVX, supplies the voltage to the memory cell array MA as signals VSGD and VSGS.

Figure 9:
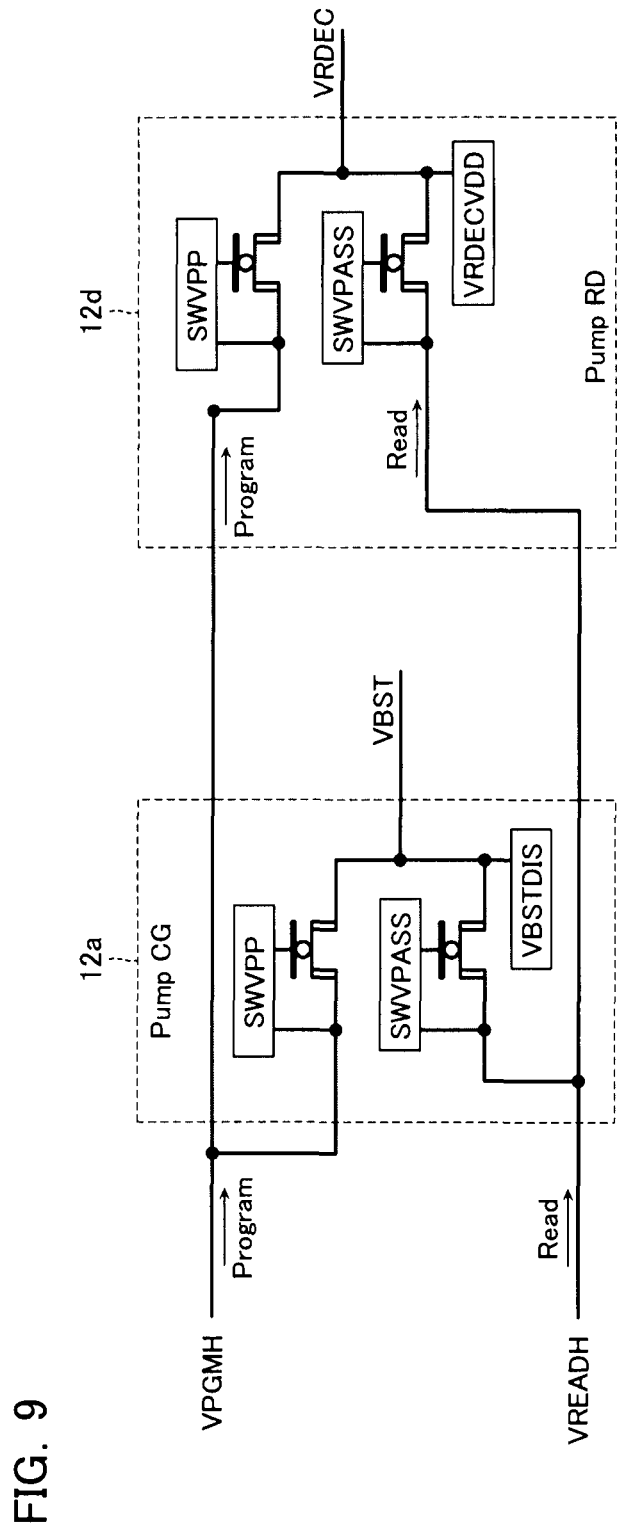
FIG. 9 is a circuit diagram showing various kinds of boost circuits according to the first embodiment.

FIG. 9 is a circuit diagram showing the boost circuits 12*a* and 12*d* for supplying, respectively, the operation voltages VRDEC and VEST to the above-described row decoders 19 and word line drive circuits 13. During the program operation or the read operation, the boost circuits 12*a* and 12*d* transfer voltages VPGMH and VREADH as operation voltages VBST and VRDEC based on control of switches SWVPP or SWV-PASS. Moreover, the boost circuits 12*a* and 12*d* include, respectively, a discharging circuit VBSTDIS or a charging circuit VRDECVDD.

[Power Supply Circuit According to Comparative Example]

First, a power supply circuit in a comparative example is described with reference to FIGS. 10-12, then a power supply circuit of the first embodiment is described.

Figure 10:
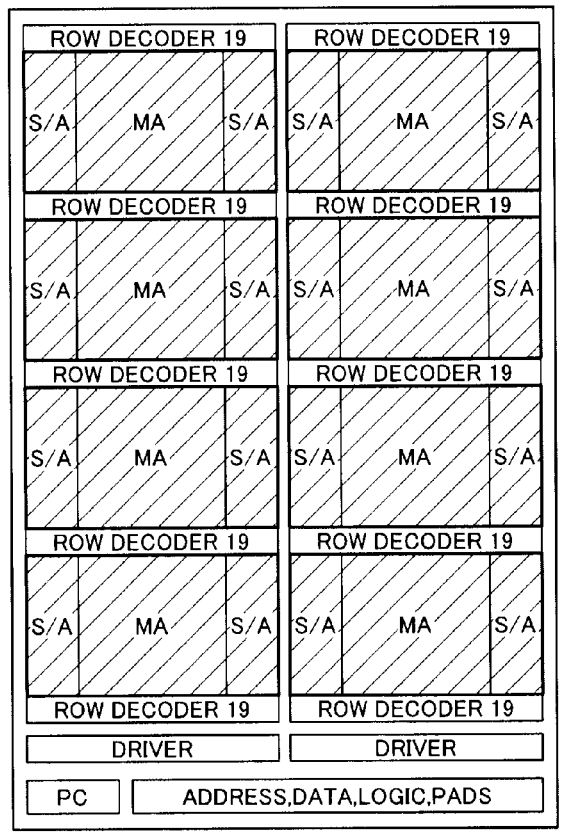
FIG. 10 is a circuit placement diagram of a peripheral circuit according to a comparative example.
Figure 11:
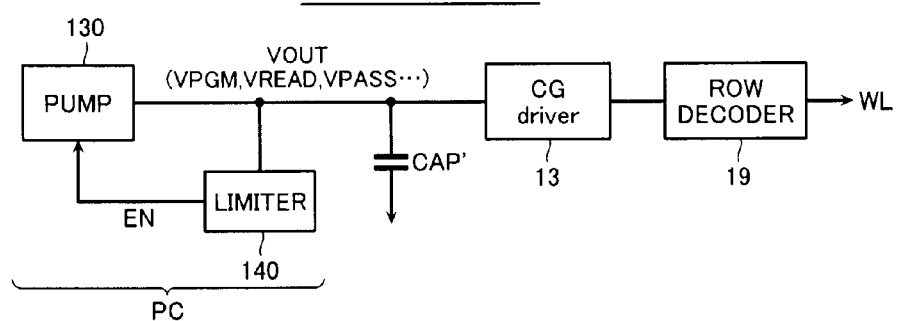
FIG. 11 is a block diagram of the peripheral circuit according to the comparative example.

FIG. 10 is a circuit placement diagram of a peripheral circuit according to the comparative example, and FIG. 11 is a block diagram of the peripheral circuit according to the comparative example. As shown in FIG. 10, a peripheral circuit including the above-mentioned row decoders 19 and various kinds of driver circuits, sense amplifiers S/A, and so on, is formed on a semiconductor substrate. In addition, a power supply circuit PC for supplying a voltage required in operation of the peripheral circuit is also formed on the substrate. As mentioned above, the memory cell array MA is formed stacked three-dimensionally, and a part of the peripheral circuit is provided also in a region underneath this memory cell array MA (diagonally lined portions of FIG. 10). FIG. 10 shows an example where the sense amplifiers S/A are provided in the region underneath the memory cell array MA.

As shown in FIG. 11, the power supply circuit in the comparative example comprises a pump circuit 130 for generating a voltage that is supplied to the memory cell array MA. Voltages (VPGM, VREAD, VPASS, and so on) generated by the pump circuit 130 and required in various operations are supplied to the word line WL of the memory cell array MA from an output terminal VOUT via the word line drive circuit 13 and the row decoder 19. In addition, the power supply circuit PC comprises a limiter circuit 140 connected to the output terminal VOUT of the pump circuit 130. When a voltage value of the output terminal VOUT of the pump circuit 130 falls below a certain value, the limiter circuit 140 outputs to the pump circuit 130 an enable signal EN for activating the pump circuit 130. Moreover, the power supply circuit PC comprises a capacitor CAP' having one end connected to the output terminal VOUT of the pump circuit 130 and configured to adjust a voltage of the output terminal VOUT.

Figure 12A:
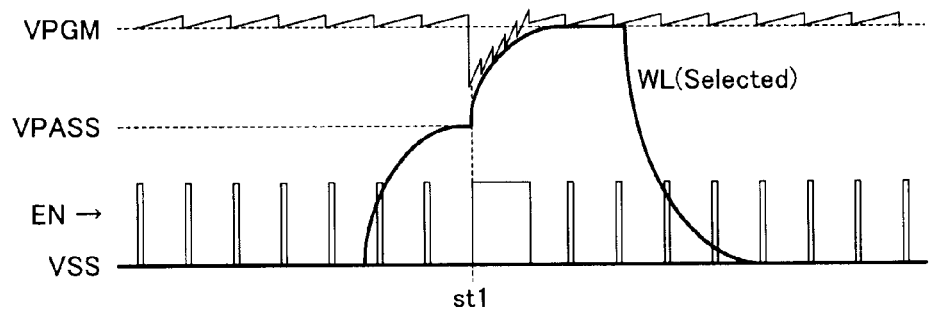
FIG. 12A is an operation waveform diagram of the peripheral circuit according to the comparative example.
Figure 12B:
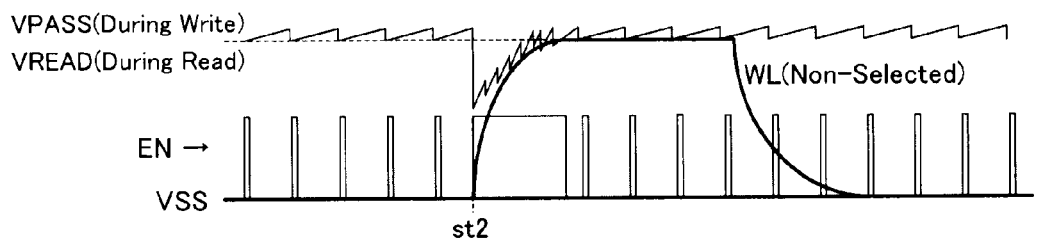
FIG. 12B is an operation waveform diagram of the peripheral circuit according to the comparative example.

Next, operation of the power supply circuit PC in the comparative example is described with reference to FIGS. 12A and 12B. FIGS. 12A and 12B are operation waveform diagrams of the peripheral circuit according to the comparative example. FIG. 12A is a voltage waveform diagram when the voltage VPGM is applied to a selected word line WL during the program operation, and FIG. 12B is a voltage waveform diagram when the voltage VPASS during the program operation or the voltage VREAD during the read operation is applied to a non-selected word line WL.

As shown at times st1 and st2 in FIGS. 12A and 12B, when the pump circuit 130 and the word line WL are connected and a voltage is applied to the word line WL, the voltage of the output terminal VOUT of the pump circuit 130 falls. This is because a distribution of charges occurs between the capacitor CAP' charged by the voltage VPGM, voltage VREAD or the like, and a load capacitance of the word line WL. The limiter circuit 140 detects this fall in voltage and outputs the enable signal EN set to "H" level, thereby activating the pump circuit 130. The pump circuit 130 continues operation until the lowered voltage returns to the voltage VPGM, voltage VREAD or the like. At this time, if it takes a long time for the voltage to return to the voltage VPGM, voltage VREAD or the like, operation speed of the semiconductor memory device is affected. It is therefore required to configure the pump circuit 130 to raise the word line WL to the voltage VPGM, voltage VREAD or the like within a permissible time (for example, 5 µs). In that case, a powerful pump circuit 130 is required and there is a risk that circuit area increases.

Therefore, consideration can also be given to disposing the pump circuit 130 beneath the memory cell array MA. However, in that case, there is a risk that parasitic capacitance between the pump circuit 130 and the memory cell array MA increases. In addition, for various reasons such as that there is a limit to the number of lines that can be provided below the memory cell array MA, efficiency of the pump circuit 130 falls, leading also to difficulty in design. It is therefore difficult to provide the pump circuit 130 in a region underneath the memory cell array MA.

[Power Supply Circuit According to First Embodiment]

In light of the above, the first embodiment adopts a power supply circuit PC having a configuration and placement as indicated below. The power supply circuit PC according to the present embodiment is described below with reference to FIGS. 13-17.

Figure 13:
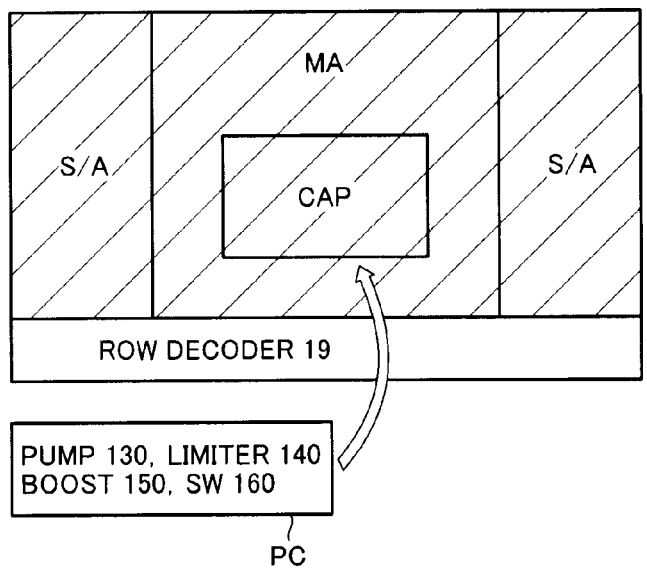
FIG. 13 is a circuit placement diagram of the peripheral circuit according to the first embodiment.
Figure 14:
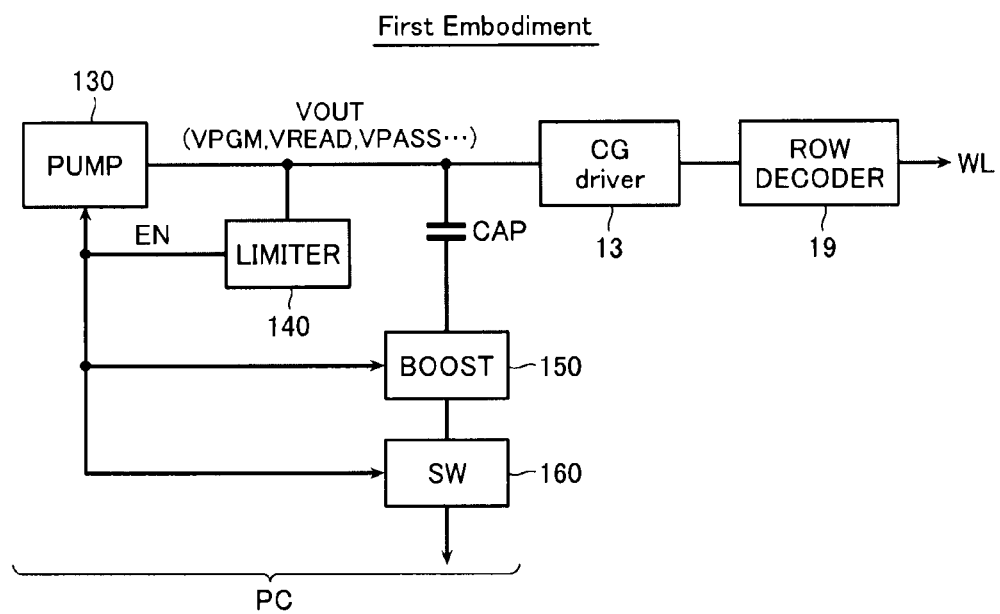
FIG. 14 is a block diagram of the peripheral circuit according to the first embodiment.

FIG. 13 is a circuit placement diagram of the peripheral circuit according to the first embodiment, and FIG. 14 is a block diagram of the peripheral circuit according to the first embodiment. Now, places having configurations similar to those in the comparative example are assigned with identical symbols and a redundant description of such places is omitted. As shown in FIGS. 13 and 14, the power supply circuit PC of the first embodiment differs from the power supply circuit PC of the comparative example in including a boost circuit 150 and a switch 160. In addition, the capacitor CAP in the first embodiment is formed with a size larger than that of the capacitor CAP' in the comparative example, and has a larger capacitance than that of the capacitor CAP' in the comparative example.

As shown in FIG. 13, in the first embodiment, sense amplifiers S/A along with the capacitor CAP are provided in the region underneath the memory cell array MA above the semiconductor substrate (diagonally lined portion of FIG. 13). FIG. 13 shows an example where the capacitor CAP is formed in a region directly below one memory cell array MA, but the capacitor CAP may also be formed in regions directly below each of a plurality of memory cell arrays MA.

In addition, as shown in FIG. 14, the boost circuit 150 in the present embodiment is connected to the capacitor CAP and charges the capacitor CAP using a certain constant current based on the enable signal EN. Moreover, the switch 160 has a function of stopping a charging operation of the boost circuit 150 based on a boost enable signal BTEN to be described later.

Figure 15:
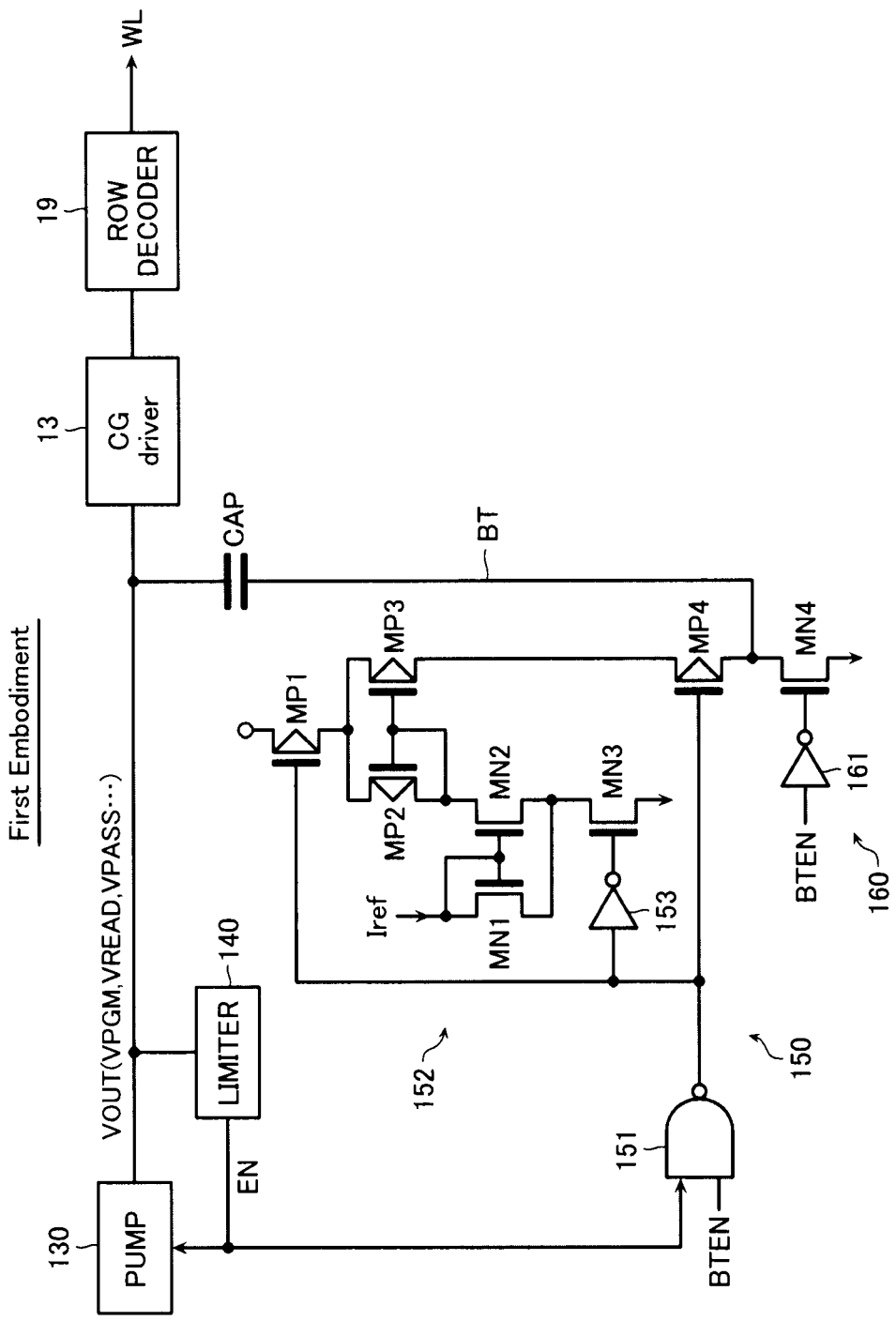
FIG. 15 is a circuit diagram of the peripheral circuit according to the first embodiment.
Figure 16:
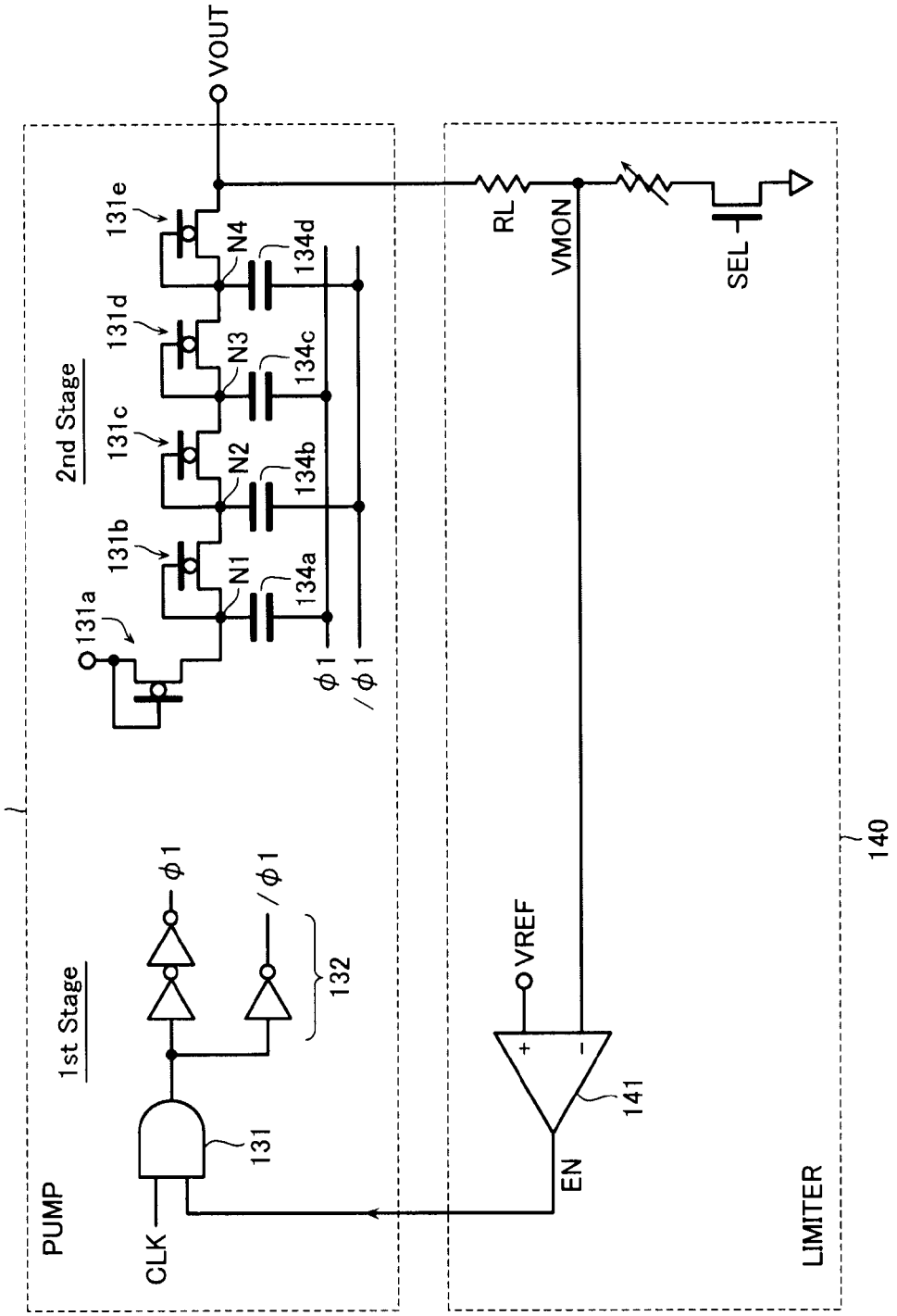
FIG. 16 is a circuit diagram of the peripheral circuit according to the first embodiment.

FIGS. 15 and 16 are circuit diagrams showing configurations of, respectively, the boost circuit 150 and switch 160, and the pump circuit 130 and limiter circuit 140, according to the first embodiment.

As shown in FIG. 15, the boost circuit 150 comprises a NAND circuit 151 and a current mirror circuit 152. When the enable signal EN and the boost enable signal BTEN are both "H" level, the NAND circuit 151 outputs a signal of "L" level. In addition, the current mirror circuit 152 includes NMOS transistors MN1-MN3, PMOS transistors MP1-MP3, and an inverter 153. A drain of transistor MN1 is connected to a constant current supply terminal. The drain and gate of transistor MN1 and a gate of transistor MN2 are connected to configure a current mirror pair. Moreover, sources of transistors MN1 and MN2 are connected to a drain of transistor MN3, and a source of transistor MN3 is grounded. An output terminal of the NAND circuit 151 is connected to an input terminal of the inverter 153, and an output terminal of the inverter 153 is connected to a gate of transistor MN3. A drain of transistor MP2 is connected to a drain of transistor MN2. The drain and gate of transistor MP2 and a gate of transistor MP3 are connected to configure a current mirror pair. Moreover, sources of transistors MP2 and MP3 are connected to a drain of transistor MP1, and a source of transistor MP1 is connected to a power supply terminal. The output terminal of the NAND circuit 151 is connected to a gate of transistor MP1. Moreover, the switch 160 includes an inverter 161 having its input terminal inputted with the boost enable signal BTEN, and transistors MN4 and MP4. Transistor MP4 has its source connected to a drain of transistor MP3, and its gate connected to the output terminal of the NAND circuit 151. Transistor MN4 has its source grounded, and its gate connected to an output terminal of the inverter 161. Drains of transistors MP4 and MN4 are both connected to a node BT.

When the boost circuit 150 is inputted with the enable signal EN of "H" level and the boost enable signal BTEN of "H" level, the NAND circuit 151 outputs a signal of "L" level. This "L" level signal is inputted to the gate of transistor MN3 via the inverter 153 and inputted to the gate of transistor MP1. As a result, transistors MP1 and MN3 become conductive and the current mirror circuit 152 begins operation. At this time, a current Iref flows from the constant current terminal toward transistor MP4 via the current mirror pairs. When the boost enable signal BTEN is "H" level and the output signal of the NAND circuit 151 is "L" level, transistor MP4 in the switch 160 is conductive, and transistor MN4 is not conductive. The constant current flows from the current mirror circuit 152 to the node BT via transistor MP4, whereby the capacitor CAP is charged. When the boost enable signal BTEN is "L" level, the node BT is discharged via transistor MN4.

As shown in FIG. 16, the pump circuit 130 comprises an AND circuit 131 which, when a clock signal CLK and the enable signal EN are both "H" level, outputs a signal having the same phase as the clock signal CLK. The signal outputted from the AND circuit 131 is outputted as oscillating signals $\phi 1$ and $\overline{\phi 1}$ by an inverter group 132 (first stage). In addition, the pump circuit 130 includes diode-connected transistors 131a-131e. Of these, transistor 131a is connected to the power supply. Moreover, pumping capacitors 134a-134d are connected to connection nodes N1-N4 of each of transistors 1311, respectively. The oscillating signals $\phi 1$ and $/\phi 1$ are supplied alternately to other ends of the pumping capacitors 134. This second stage portion of the pump circuit 130 configures a charge pump, and a voltage required in an operation is outputted from transistor 131e.

A node VMON of the limiter circuit 140 is connected to an output terminal VOUT of the pump circuit 130 via a resistance RL. The limiter circuit 140 includes a differential amplifier 141, and the differential amplifier 141 has its inverting input terminal and non-inverting input terminal connected to, respectively, the node VMON and a reference voltage VREF. The inverting input terminal and the non-inverting input terminal of the differential amplifier 141 may be connected to the reference voltage VREF and the node VMON, respectively. When a voltage of the node VMON falls below the reference voltage VREF, this differential amplifier 141 sets the enable signal EN to "H" level. This enable signal EN is inputted to the AND circuit 131 of the pump circuit 130.

Figure 17A:
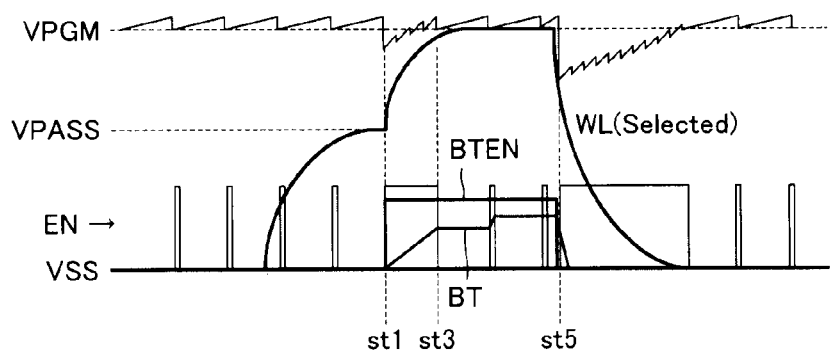
FIG. 17A is an operation waveform diagram of the peripheral circuit according to the first embodiment.
Figure 17B:
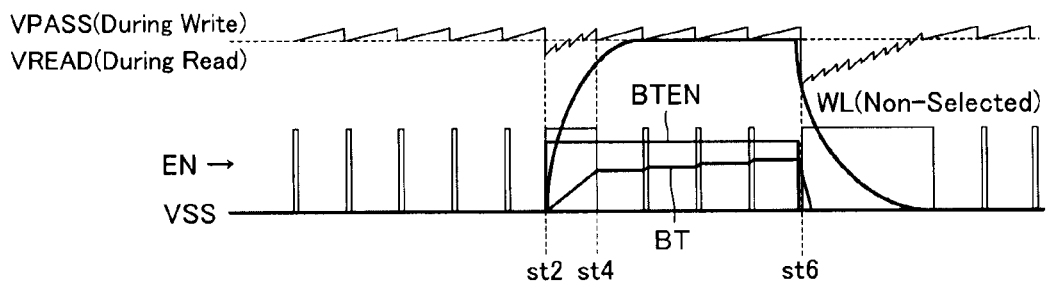
FIG. 17B is an operation waveform diagram of the peripheral circuit according to the first embodiment.

Next, operation of the power supply circuit PC in the first embodiment is described with reference to FIGS. 17A and 17B. FIGS. 17A and 17B are operation waveform diagrams of the peripheral circuit according to the first embodiment. FIG. 17A is a voltage waveform diagram when the voltage VPGM is applied to a selected word line WL during the program operation, and FIG. 17B is a voltage waveform diagram when the voltage VPASS during the program operation or the voltage VREAD during the read operation is applied to a non-selected word line WL.

As shown at times st1 and st2 in FIG. 17, when the pump circuit 130 and the word line WL are connected and a voltage is applied to the word line WL, an output voltage of the pump circuit 130 falls. Now, the capacitor CAP in the present embodiment is provided in the region directly below the memory cell array MA and has a large capacitance. Therefore, an amount of the fall in voltage of the pump circuit 130 is small compared to the comparative example shown in FIG. 12.

In addition, at times st1 and st2, the power supply circuit PC of the present embodiment sets the boost enable signal BTEN to "H" level. Moreover, the limiter circuit 140 detects the drop in voltage of the pump circuit 130, and outputs the enable signal EN set to "H" level. Therefore, at times st1 and st2 and thereafter, the boost circuit 150 is activated thereby charging the node BT. Output of the pump circuit 130 returns to a certain voltage and, when the enable signal EN outputted from the limiter circuit 140 changes to "L" level, charging of the node BT stops (times st3 and st4). Subsequently, in the period when a voltage is applied to the selected word line WL from the pump circuit 130 (times st3-st5 and st4-st6), the boost enable signal BTEN is held at "H" level, thereby maintaining a charged state of the node BT.

At times st5 and st6, when operation is completed and the word line WL is discharged, the boost enable signal BTEN is set to "L" level. This causes the node BT to be discharged and the output terminal VOUT of the pump circuit 130 also to be discharged. Subsequently, the pump circuit 130 operates until the output terminal VOUT returns to the voltage VPGM or voltage VREAD.

[Advantages of First Embodiment]

The pump circuit 130 in the comparative example requires a powerful pump circuit to raise the word line WL to the voltage VPGM, voltage VREAD or the like within a permissible time. As a result, there is a risk that area of the capacitor CAP in the pump circuit increases, whereby circuit area increases. In contrast, in the power supply circuit PC of the present embodiment, the capacitor CAP of large capacitance is provided in the region directly below the memory cell array MA, whereby area of the capacitor CAP in the pump circuit can be increased while preventing increase in circuit area. As a result, it is possible to provide a nonvolatile semiconductor memory device in which chip area can be reduced. Moreover, in the power supply circuit PC of the present embodiment, the capacitor CAP of large capacitance can be charged by the boost circuit 150, hence the amount of the fall in voltage of the output terminal VOUT of the pump circuit 130 can be reduced.

In addition, although it is required to charge the output terminal VOUT again after the word line WL and capacitor CAP have been discharged, this recharging need only be completed by the next time of the operation. Since the permissible time for completion of charging of the output terminal VOUT extends, there is no need to enlarge the configuration of the pump circuit 130. As a result, area of the pump circuit 130 disposed in other than an under-region of the memory cell array MA can be reduced. Extending of the permissible time for completion of charging is advantageous also for peak current reduction. For example, when simultaneously operating a plurality of NAND type flash memory chips in a system such as SDD (Solid State Drive), reducing the peak current per one chip of the NAND type flash memory allows more chips to be operated. As a result, data transfer speed as a system comprising memory chips can also be raised. In addition, the capacitor CAP of large size is disposed underneath the memory cell array MA, hence there is no increase in chip area. Therefore, chip area of the power supply circuit PC overall can be reduced.

The capacitor CAP is charged by the constant current from the boost circuit 150 while undergoing control of charging speed. This allows charging to be stopped promptly and voltage overshoot to be prevented after charging to the certain voltage is performed.

Second Embodiment

Next, a nonvolatile semiconductor memory device in a second embodiment is described with reference to FIGS. 18 and 19. An overall configuration of the nonvolatile semiconductor memory device of the present embodiment is similar to that of the first embodiment, hence a detailed description thereof is omitted. In addition, places having configurations similar to those in the first embodiment are assigned with identical symbols and a redundant description of such places is omitted.

Figure 18:
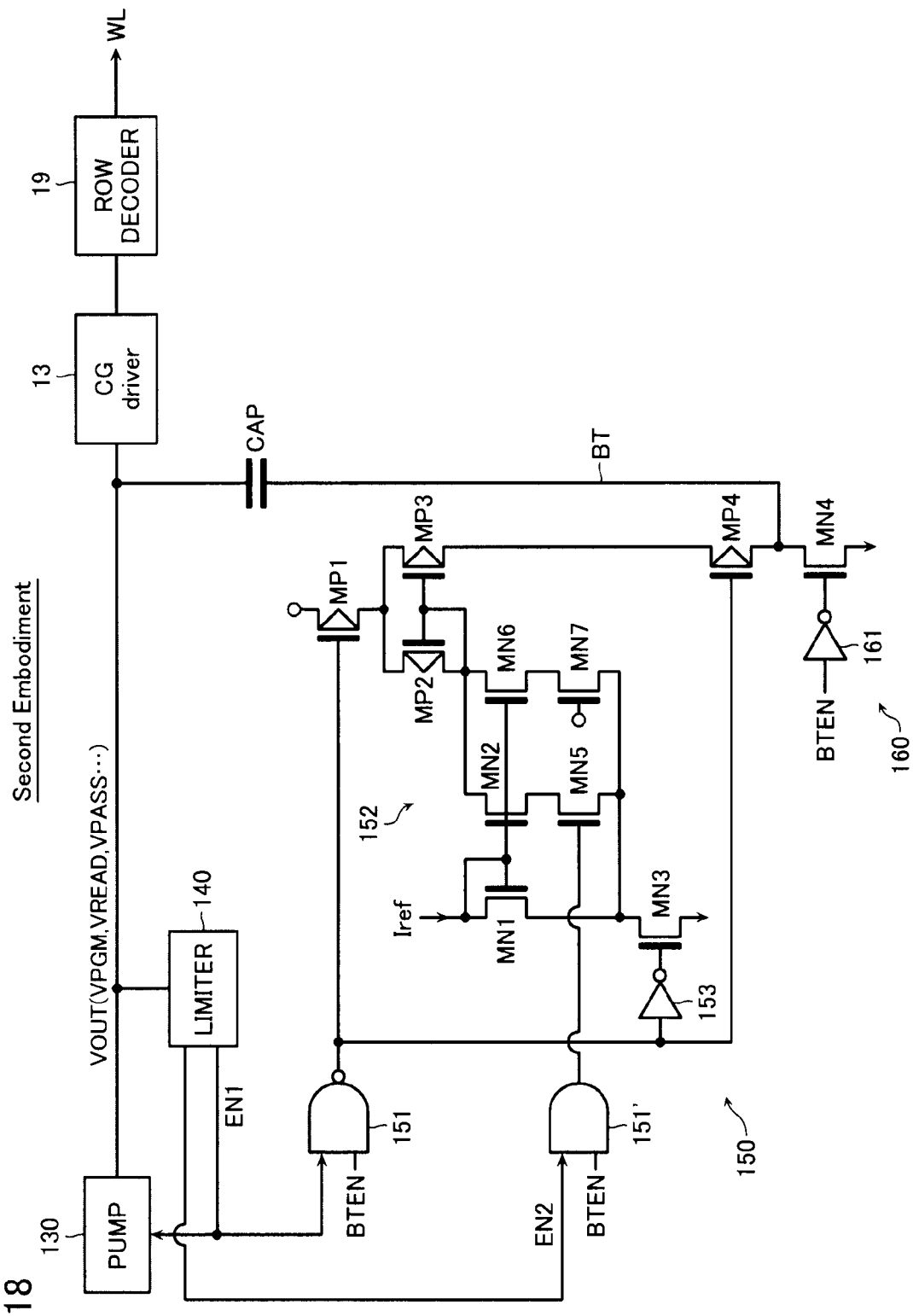
FIG. 18 is a circuit diagram of a peripheral circuit according to a second embodiment.

FIG. 18 is a circuit diagram showing a configuration of the boost circuit 150 and the switch 160 according to the second embodiment. The boost circuit in the present embodiment differs from that of the first embodiment in being configured capable of changing a value of the constant current for charging the node BT.

As shown in FIG. 18, the limiter circuit 140 of the present embodiment outputs two kinds of enable signals EN1 and EN2 according to a voltage of the output terminal VOUT of the boost circuit 150. The enable signal EN2 has a reference voltage set lower than that of the enable signal EN1. When the voltage of the output terminal VOUT falls, the enable signals EN1 and EN2 both become "H" level, then, when the voltage of the output terminal VOUT rises, change to "L" level in the order of enable signals EN2 and EN1.

The boost circuit 150 comprises an AND circuit 151' which outputs a signal of level "H" when the enable signal EN2 and the boost enable signal BTEN are both "H" level. In addition, the boost circuit 150 includes NMOS transistors MN5-MN7 in the current mirror circuit 152. Transistor MN5 is connected between transistor MN2 and transistor MN3 and has its gate inputted with the output signal of the AND circuit 151'. Transistors MN6 and MN7 are connected in series between transistor MP2 and transistor MN3. A gate of transistor MN6 is connected to gates of transistors MN1 and MN2, and a gate of transistor MN7 is connected to the power supply terminal.

When the enable signals EN1 and EN2 are both "H" level, transistors MN5-MN7 become a conductive state, and a value of the constant current flowing from the current mirror circuit 152 via transistor MP4 into the node BT becomes larger than in the first embodiment. Then, when the voltage of the output terminal VOUT rises and the enable signal EN2 becomes "L" level, transistor MN5 becomes a non-conductive state, whereby the value of the constant current flowing into the node BT reduces.

Figure 19:
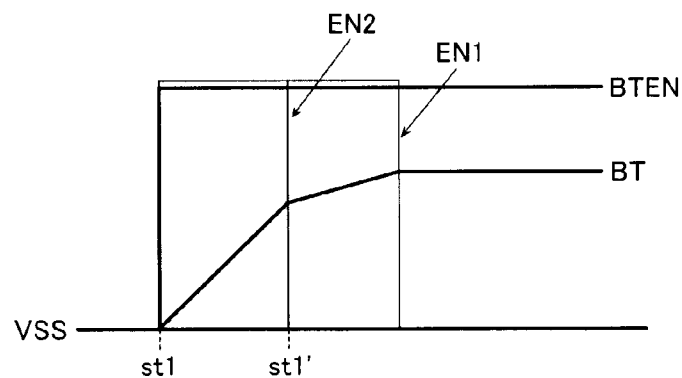
FIG. 19 is an operation waveform diagram of the peripheral circuit according to the second embodiment.

FIG. 19 is an operation waveform diagram of the peripheral circuit according to the second embodiment. As shown in FIG. 19, at time st1, when the boost enable signal BTEN and the enable signals EN1 and EN2 are all "H" level, charging of the node BT starts. At an early period of charging, the amount of constant current flowing into the node BT is large, and charging speed is fast. Subsequently, at time st1', when the enable signal EN2 becomes "L" level, charging speed of the node BT slows down, and when the enable signal EN1 becomes "L" level, charging of the node BT finishes.

[Advantages of Second Embodiment]

Likewise in the power supply circuit PC of the present embodiment, the capacitor CAP of large capacitance is provided in the region directly below the memory cell array MA, hence the amount of the fall in voltage of the output terminal VOUT of the pump circuit 130 can be reduced. In addition, the capacitor CAP of large size is disposed underneath the memory cell array MA, hence there is no increase in chip area. Therefore, chip area of the power supply circuit PC overall can be reduced.

The capacitor CAP can change the current value of the constant current from the boost circuit 150. This makes it possible to perform charging while controlling charging speed. Consequently, charging speed can be suppressed when the voltage of the node BT approaches a certain voltage. As a result, voltage overshoot can be more advantageously prevented.

[Other]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, the configuration of the peripheral circuit, power supply circuit, and so on, described in the embodiments was shown merely as one example, and various other configurations may also be adopted.

What is claimed is:

1. A nonvolatile semiconductor memory device, comprising:
    a semiconductor substrate;
    a memory cell array including a plurality of memory cells, the memory cells being stacked above the semiconductor substrate and being connected in series; and
    a power supply circuit configured to supply a first voltage to the memory cell array,
    the power supply circuit comprising:
    a pump circuit configured to generate the first voltage and supply the first voltage to the memory cell array;
    a limiter circuit connected to an output terminal of the pump circuit, the limiter circuit being configured to output a control signal for activating the pump circuit according to a comparison result between a voltage value of the output terminal and a first value;
    a capacitor having one end connected to the output terminal, the capacitor being provided between the memory cell array and the semiconductor substrate;
    a boost circuit connected to the other end of the capacitor, the boost circuit being configured to charge the capacitor by using a current based on the control signal; and
    a switch configured to inhibit a charge operation of the boost circuit.

2. The nonvolatile semiconductor memory device according to claim 1, wherein
    the boost circuit is configured capable of changing the current.

3. The nonvolatile semiconductor memory device according to claim 2, wherein
    the boost circuit is configured to execute an operation that charges the capacitor in a first period when the first voltage is supplied to the memory cell array.

4. The nonvolatile semiconductor memory device according to claim 1, wherein
    the memory cell array comprises:
    a memory unit comprising a memory string and select transistors, the memory string including the memory cells connected in series, and one of the select transistors being connected to one end of the memory string, the other of the select transistors being connected to the other end of the memory string;
    a bit line connected to one end of the memory unit; and
    a source line connected to the other end of the memory unit, and
    the memory string comprising:
    a columnar semiconductor layer extending in a direction perpendicular to the semiconductor substrate;
    a charge accumulation layer surrounding a surface of the columnar semiconductor layer; and
    a first conductive layer surrounding a surface of the charge accumulation layer, and being electrically connected to a gate of the memory cell.

5. The nonvolatile semiconductor memory device according to claim 4, wherein
    the memory string further comprises a joint semiconductor layer for joining lower ends of a pair of the columnar semiconductor layers.

6. The nonvolatile semiconductor memory device according to claim 1, wherein
the pump circuit, the limiter circuit, the boost circuit, and the switch are provided at an area other than directly below the memory cell array.

7. The nonvolatile semiconductor memory device according to claim 1, further comprising
a control circuit configured to control operations to be performed to the memory cell array, a part of the control circuit being provided directly below the memory cell array and being provided between the memory cell array and the semiconductor substrate.

8. A nonvolatile semiconductor memory device, comprising:
a semiconductor substrate;
a memory cell array including a plurality of memory cells, the memory cells being stacked above the semiconductor substrate and being connected in series in a perpendicular direction with respect to the semiconductor substrate;
a power supply circuit configured to supply a first voltage to the memory cell array; and
a control circuit configured to control operations to be performed to the memory cell array,
a part of the power supply circuit and a part of the control circuit being provided between the memory cell array and the semiconductor substrate.

9. The nonvolatile semiconductor memory device according to claim 8, wherein
the power supply circuit comprises:
a pump circuit configured to generate the first voltage and supply the first voltage to the memory cell array;
a limiter circuit connected to an output terminal of the pump circuit, the limiter circuit being configured to output a control signal for activating the pump circuit according to a comparison result between a voltage value of the output terminal and a first value;
a capacitor having one end connected to the output terminal;
a boost circuit connected to the other end of the capacitor, the boost circuit being configured to charge the capacitor by using a current based on the control signal; and
a switch configured to inhibit a charge operation of the boost circuit.

10. The nonvolatile semiconductor memory device according to claim 9, wherein
the capacitor is provided directly below the memory cell array.

11. The nonvolatile semiconductor memory device according to claim 9, wherein
the boost circuit is configured capable of changing the current.

12. The nonvolatile semiconductor memory device according to claim 11, wherein
the boost circuit is configured to execute an operation that charges the capacitor in a first period when the first voltage is supplied to the memory cell array.

13. The nonvolatile semiconductor memory device according to claim 8, wherein
the memory cell array comprises:
a memory unit comprising a memory string and select transistors, the memory string including the memory cells connected in series, and one of the select transistors being connected to one end of the memory string, the other of the select transistors being connected to the other end of the memory string;
a bit line connected to one end of the memory unit; and
a source line connected to the other end of the memory unit, and
the memory string comprising:
a columnar semiconductor layer extending in a direction perpendicular to the semiconductor substrate;
a charge accumulation layer surrounding a surface of the columnar semiconductor layer; and
a first conductive layer surrounding a surface of the charge accumulation layer, and being electrically connected to a gate of the memory cell.

14. The nonvolatile semiconductor memory device according to claim 13, wherein
the memory string further comprises a joint semiconductor layer for joining lower ends of a pair of the columnar semiconductor layers.

15. The nonvolatile semiconductor memory device according to claim 9, wherein
the pump circuit, the limiter circuit, the boost circuit, and the switch are provided at an area other than directly below the memory cell array.

16. A nonvolatile semiconductor memory device, comprising:
a semiconductor substrate;
a memory cell array including a plurality of memory cells, the memory cells being stacked above the semiconductor substrate and being connected in series; and
a power supply circuit configured to supply a first voltage to the memory cell array,
the power supply circuit comprising:
a pump circuit configured to supply the first voltage to the memory cell array; and
a capacitor having one end connected to an output terminal of the pump circuit, the capacitor being provided between the memory cell array and the semiconductor substrate.

17. The nonvolatile semiconductor memory device according to claim 16, wherein
the memory cell array comprises:
a memory unit comprising a memory string and select transistors, the memory string including the memory cells connected in series, and one of the select transistors being connected to one end of the memory string, the other of the select transistors being connected to the other end of the memory string;
a bit line connected to one end of the memory unit; and
a source line connected to the other end of the memory unit, and
the memory string comprising:
a columnar semiconductor layer extending in a direction perpendicular to the semiconductor substrate;
a charge accumulation layer surrounding a surface of the columnar semiconductor layer; and
a first conductive layer surrounding a surface of the charge accumulation layer, and being electrically connected to a gate of the memory cell.

18. The nonvolatile semiconductor memory device according to claim 17, wherein
the memory string further comprises a joint semiconductor layer for joining lower ends of a pair of the columnar semiconductor layers.

19. The nonvolatile semiconductor memory device according to claim 16, wherein
the pump circuit is provided at an area other than directly below the memory cell array.

20. The nonvolatile semiconductor memory device according to claim 16, further comprising a control circuit configured to control operations to be performed to the memory cell array, a part of the control circuit being provided directly below the memory cell array and being provided between the memory cell array and the semiconductor substrate.

* * * * *